(12) United States Patent
Jang et al.

(10) Patent No.: US 12,250,841 B2
(45) Date of Patent: Mar. 11, 2025

(54) LIGHT EMITTING DEVICE PACKAGE AND APPLICATION THEREOF

(71) Applicant: Seoul Viosys Co., Ltd., Ansan-si (KR)

(72) Inventors: Jong Min Jang, Ansan-si (KR); Chang Youn Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 18/242,518

(22) Filed: Sep. 5, 2023

(65) Prior Publication Data

US 2023/0411571 A1    Dec. 21, 2023

Related U.S. Application Data

(63) Continuation of application No. 17/881,512, filed on Aug. 4, 2022, now Pat. No. 11,784,292, which is a (Continued)

(51) Int. Cl.
*H10H 20/853* (2025.01)
*H01L 25/13* (2006.01)
(Continued)

(52) U.S. Cl.
CPC .......... *H10H 20/853* (2025.01); *H01L 25/13* (2013.01); *H10H 20/01* (2025.01);
(Continued)

(58) Field of Classification Search
CPC ... H01L 33/54; H01L 25/13; H01L 2933/005; H10H 20/853; H10H 25/13
(Continued)

(56) References Cited

U.S. PATENT DOCUMENTS 6,100,103 A    8/2000   Shim et al.
8,552,444 B2   10/2013  Ide et al.
(Continued)

FOREIGN PATENT DOCUMENTS

CN    101855735 A   10/2010
CN    211295141 U    8/2020
(Continued)

OTHER PUBLICATIONS

Non-Final Office Action dated Jun. 21, 2021, issued to U.S. Appl. No. 16/819,78.
(Continued)

*Primary Examiner* — Igwe U Anya
(74) *Attorney, Agent, or Firm* — Oblon, McClelland, Maier & Neustadt, L.L.P.

(57) ABSTRACT

A light emitting device including a printed circuit board having a front surface and a rear surface, at least one light emitting source disposed on the front surface to emit light in a direction away from the printed circuit board, and a molding layer surrounding the light emitting source, in which the light emitting source includes a light emitting structure, a substrate disposed on the light emitting structure, and a plurality of bump electrodes disposed between the light emitting structure and the printed circuit board, the molding layer covers an upper surface of the substrate and a fine concavo-convex part is formed on a surface of the molding layer exposed to the outside, and the molding layer has a first thickness to transmit at least a fraction of light emitted from the light emitting source, and includes a filler to change a direction of emitted light.

19 Claims, 20 Drawing Sheets

Related U.S. Application Data continuation of application No. 16/819,786, filed on Mar. 16, 2020, now Pat. No. 11,437,551.

(60) Provisional application No. 62/820,482, filed on Mar. 19, 2019.

(51) Int. Cl.
*H10H 20/01* (2025.01)
*H10H 20/813* (2025.01)
*H10H 20/854* (2025.01)
*H10H 20/857* (2025.01)

(52) U.S. Cl.
CPC ........ *H10H 20/813* (2025.01); *H10H 20/854* (2025.01); *H10H 20/857* (2025.01); *H10H 20/0362* (2025.01)

(58) Field of Classification Search
USPC .......................................................... 257/88
See application file for complete search history.

(56) References Cited

U.S. PATENT DOCUMENTS

| | | | |
|---|---|---|---|
| 11,784,292 B2* | 10/2023 | Jang | .................... H01L 33/0095 257/88 |
| 2003/0047742 A1 | 3/2003 | Hen | |
| 2007/0189007 A1 | 8/2007 | Nishimoto et al. | |
| 2009/0050926 A1 | 2/2009 | Suehiro et al. | |
| 2010/0127288 A1 | 5/2010 | Kuo et al. | |
| 2010/0258830 A1* | 10/2010 | Ide | .......................... H01L 24/97 257/E33.059 |
| 2011/0316006 A1* | 12/2011 | Xu | .......................... H01L 33/56 438/27 |
| 2012/0074441 A1 | 3/2012 | Seo et al. | |
| 2013/0001636 A1 | 1/2013 | Lo et al. | |
| 2014/0175466 A1 | 6/2014 | De Samber | |
| 2014/0186979 A1* | 7/2014 | Tu | ......................... H10H 20/018 438/27 |
| 2015/0295154 A1* | 10/2015 | Tu | .......................... H10D 1/021 438/27 |
| 2016/0247984 A1* | 8/2016 | Liu | ......................... H01L 33/54 |
| 2016/0293811 A1* | 10/2016 | Hussell | ................ H10H 20/857 |
| 2017/0092822 A1 | 3/2017 | Amako et al. | |
| 2017/0141275 A1* | 5/2017 | Kim | ........................ H01L 33/50 |
| 2017/0288093 A1 | 10/2017 | Cha et al. | |
| 2018/0033924 A1 | 2/2018 | Andrews et al. | |
| 2018/0062052 A1 | 3/2018 | Bohmer et al. | |
| 2018/0097158 A1* | 4/2018 | Estrada | ................. C09C 1/0081 |
| 2019/0019839 A1 | 1/2019 | Tian et al. | |
| 2019/0285950 A1 | 9/2019 | Liu et al. | |
| 2019/0371974 A1* | 12/2019 | Hussell | .................... G09G 3/32 |

FOREIGN PATENT DOCUMENTS

| | | |
|---|---|---|
| EP | 2221885 | 8/2010 |
| JP | 2009-258455 | 11/2009 |
| JP | 2010-62351 A | 3/2010 |
| JP | 2014-229822 A | 12/2014 |
| KR | 10-2010-0010102 | 2/2010 |
| KR | 10-2018-0040073 | 4/2018 |
| KR | 10-2019-0026617 | 3/2019 |
| WO | WO 2018/176657 A1 | 10/2018 |

OTHER PUBLICATIONS

Final Office Action dated Dec. 17, 2021, issued to U.S. Appl. No. 16/819,786.
Notice of Allowance dated Apr. 5, 2022, issued to U.S. Appl. No. 16/819,786.
International Search Report mailed on Jul. 3, 2020, issued in International Application No. PCT/KR2020/003744.
European Search Report dated Sep. 11, 2022, issued to European Patent Application No. 20774480.6.
European Search Report dated Feb. 8, 2023, issued to European Patent Application No. 20774480.6.
Non-Final Office Action dated Apr. 27, 2023, in U.S. Appl. No. 17/881,512.
Notice of Allowance dated Aug. 9, 2023, in U.S. Appl. No. 17/881,512.
Japanese Office Action issued on Jan. 23, 2024 in Japanese Patent Application No. 2021-556345 (with unedited computer-generated English translation), 16 pages.
Combined Chinese Office Action and Search Report issued Mar. 19, 2024 in Chinese Patent Application No. 202080022651.4 (with English Translation of Category of Cited Documents), 13 pages.
Japanese Office Action issued Jul. 9, 2024 in Japanese Patent Application No. 2021-556345, 3 pages.

\* cited by examiner

LIGHT EMITTING DEVICE PACKAGE AND APPLICATION THEREOF

CROSS-REFERENCE TO RELATED APPLICATIONS

This application is a Continuation of U.S. patent application Ser. No. 17/881,512, filed on Aug. 4, 2022, which is a Continuation of U.S. patent application Ser. No. 16/819,786, filed on Mar. 16, 2020, now issued as U.S. Pat. No. 11,437,551, which claims the benefit of U.S. Provisional Application No. 62/820,482, filed on Mar. 19, 2019, each of which is hereby incorporated by reference for all purposes as if fully set forth herein.

BACKGROUND

Field

Exemplary embodiments of the invention relate generally to a light emitting device package and, more specifically, to an application thereof.

Discussion of the Background

Recently, various devices using a light emitting diode (LED) have been developed. Examples of devices using a light emitting diode as a light source include general lighting and display devices. Structures of red "R" light emitting diode (LED), green "G" LED, and blue "B" LED are grown individually, and are formed on a final substrate to obtain devices using the light emitting diode For applying the above-described light emitting diode to various devices, the structures may need to be simple to facilitate manufacture.

SUMMARY

Light emitting device packages constructed according to exemplary embodiments of the invention have a simple structure that facilitate manufacture.

Additional features of the inventive concepts will be set forth in the description which follows, and in part will be apparent from the description, or may be learned by practice of the inventive concepts.

A light emitting device package according to an exemplary embodiment includes a printed circuit board having a front surface and a rear surface, at least one light emitting device disposed on the front surface and emitting a light in a direction toward the front surface, and a molding layer disposed on the printed circuit board and surrounding the light emitting device, in which the light emitting device includes a light emitting structure disposed on the printed circuit board, a substrate disposed on the light emitting structure, and a plurality of bump electrodes disposed between the light emitting structure and the printed circuit board, and the molding layer covers an upper surface of the substrate and includes a fine concavo-convex part formed on a surface of the molding layer exposed to the outside.

The fine concavo-convex part may be formed by at least one of plasma treatment, micro sand blaster treatment, pattern transfer, dry polishing, and wet etching.

The molding layer may include fillers exposed through the fin concavo-convex part.

A top surface of the molding layer may have a substantially uniform height throughout.

The molding layer may partially reflect, scatter, or absorb an external light.

The molding layer may be at least partially filled between the light emitting structure and the printed circuit board.

The molding layer may have an external light reflectance, an external light scattering rate, or an external light absorbance of about 50% or more.

The molding layer may have a black color.

The printed circuit board may include upper electrodes disposed on the front surface, lower electrodes disposed on the rear surface, and via electrodes connecting the upper electrodes and the lower electrodes, and the bump electrodes may be connected to corresponding upper electrodes.

A distance between two adjacent lower electrodes may be greater than a distance between two adjacent upper electrodes.

The light emitting device may be provided in plural. For example, the light emitting devices may be provided in four, and the light emitting structure of each light emitting device may include a plurality of epitaxial stacks sequentially stacked on the substrate to emit light having different wavelength bands from each other and having light emitting regions overlapping one another.

The plurality of epitaxial stacks may include a first epitaxial stack emitting a first light, a second epitaxial stack provided on the first epitaxial stack and emitting a second light having a wavelength band different from a wavelength band of the first light, and a third epitaxial stack provided on the second epitaxial stack and emitting a third light of a wavelength band different from the wavelength bands of the first and second lights.

Each of the first to third epitaxial stacks may include a first semiconductor layer, a second semiconductor layer, and an active layer provided between the first and second semiconductor layers.

The bump electrodes may include a first bump electrode connected to the first semiconductor layer of the first epitaxial stack, a second bump electrode connected to the first semiconductor layer of the second epitaxial stack, a third bump electrode connected to the first semiconductor layer of the third epitaxial stack, and a fourth bump electrode connected to the second semiconductor layers of the first to third epitaxial stacks.

The light emitting devices may include first to fourth light emitting devices, the lower electrodes may include first to sixth scan pads and first and second data pads, the first light emitting device may be connected to the first to third scan pads and the first data pad, the second light emitting device may be connected to the first to third scan pads and the second data pad, the third light emitting device may be connected to the fourth to sixth scan pads and the first data pad, and the fourth light emitting device may be connected to the fourth to sixth scan pads and the second data pad.

The bump electrodes in each light emitting device may include the first to fourth bump electrodes, first to third scan signals may be applied to the first to third bump electrodes, and a data signal may be applied to the fourth bump electrode.

The molding layer may include an organic polymer material.

The light emitting device package may be employed in a display device or a vehicle lighting device. In this case, the light emitting device package may include a base substrate and at least one light emitting device package provided on the base substrate.

A method of manufacturing a light emitting device package according to another exemplary embodiment includes forming light emitting devices, mounting the light emitting devices on a printed circuit board, forming a molding layer on the printed circuit board using a vacuum laminate method to cover the light emitting devices, treating the surface of the molding layer exposed to the outside to form a fine concavo-convex part on the surface of the molding layer, and cutting the printed circuit board and the molding layer to form the light emitting device package, in which the molding layer covers a top surface of the substrate and includes a material which reflects, scatters, or absorbs some external light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

The above and other objects and features will become apparent from the following description with reference to the following figures, wherein like reference numerals refer to like parts throughout the various figures unless otherwise specified, and wherein:

FIGS. 3A, 4A, 5A, 6A, and 7A are plan views, and FIGS. 3B. 4B, 5B, 6B, and 7B are cross-sectional views taken along line A-A' of FIGS. 3A, 4A, 5A, 6A, and 7A.

FIG. 11A is a top view illustrating four light emitting devices mounted in a matrix on one printed circuit board.

DETAILED DESCRIPTION

Figure 1:
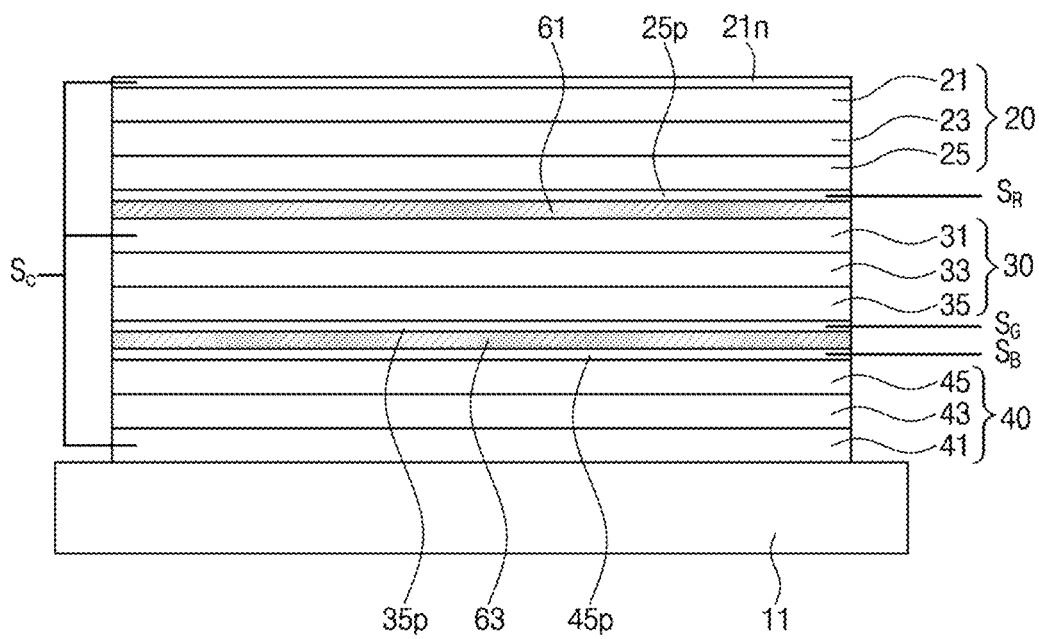
FIG. 1 is a cross-sectional view illustrating a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view illustrating a light emitting device according to an exemplary embodiment.

Referring to FIG. 1, a light emitting device according to an exemplary embodiment includes a light emitting structure including a plurality of epitaxial stacks sequentially stacked. The light emitting structure is provided on a substrate 11.

The substrate 11 may have a plate shape with a front surface and a rear surface.

The light emitting structure may include at least two or more epitaxial stacks, each of which may emit light having a different wavelength band. In particular, the epitaxial stack is provided in plural numbers, and each of the epitaxial stack may emit light having the same or different energy bands. In the illustrated exemplary embodiment, the light emitting structure is illustrated as including three layers in which epitaxial stacks are sequentially stacked on the front surface of the substrate 11. A third epitaxial stack 40, a second epitaxial stack 30, and a first epitaxial stack 20 are sequentially stacked on the front surface of the substrate 11.

The substrate 11 may be formed of a light transmissive insulating material.

The substrate 11 may be one of growth substrates capable of growing the epitaxial stack, e.g., the third epitaxial stack 40, on the front surface of the substrate 11. In an exemplary embodiment, the substrate 11 may be sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon (Si).

Each epitaxial stack emits light toward the rear surface of the substrate 11 (a lower direction in FIG. 1). In this case, light emitted from one epitaxial stack travels toward the rear surface of the substrate 11 while passing through another epitaxial stack located along an optical path.

In the illustrated exemplar embodiment, the first epitaxial stack 20 may emit a first light, the second epitaxial stack 30 may emit the second light, and the third epitaxial stack may emit a third light. The first to third lights may be the same light or may be different light. In an exemplary embodiment, the first to third lights may be colored lights in a visible light wavelength band.

In an exemplary embodiment, the first to third lights may be light having different wavelength bands having sequentially short wavelengths. More particularly, the first to third lights may have the same or different wavelength bands. In addition, the first light to the third light may have sequentially short wavelengths, which have sequentially high energy. In the illustrated exemplary embodiment, the first light may be a red light, the second light may be a green light, and the third light may be a blue light. However, the first to third lights may be light having different wavelength bands sequentially having long wavelengths, or may be light having different wavelength bands arranged irregularly regardless of the length of the wavelength. In one exemplary embodiment, the first light may be a red light, the second light may be a blue light, and the third light may be a green light.

In the light emitting structure having the structure described above according to an exemplary embodiment, each epitaxial stack is independently connected to each signal line for applying a light emission signal, and thus, each epitaxial stack may be independently driven. In this manner, various colors may be implemented depending on whether light is emitted from each epitaxial stack. In addition, the epitaxial stacks emitting light of different wavelengths are formed to vertically overlap each other, and thus, it is possible to form a small area.

In particular, in the light emitting stack structure according to an exemplary embodiment, the third epitaxial stack 40 may be provided on the substrate 11, the second epitaxial stack 30 may be provided on the third epitaxial stack 40 with a second adhesive layer 63 interposed therebetween, and the first epitaxial stack 20 may be provided on the second epitaxial stack 30 with a first adhesive layer 61 interposed therebetween.

The first and second adhesive layers 61 and 63 may be made of a non-conductive material, and include a material having light transmittance. For example, an optically clear adhesive may be used for the first and second adhesive layers 61 and 63. However, the inventive concepts are not limited thereto, and in some exemplary embodiments, the first and second adhesive layers 61 and 63 may be optically transparent to a specific wavelength. For example, the first and second adhesive layers 61 and 63 may be color filters showing a predetermined color by transmitting only a specific wavelength. The color of the color filters may be selected from various colors, for example, may be red, blue, or green, or may be colors other than red, blue, or green.

The third epitaxial stack 40 includes an n-type semiconductor layer 41, an active layer 43, and a p-type semiconductor layer 45 sequentially disposed from bottom to top. The n-type semiconductor layer 41, the active layer 43, and the p-type semiconductor layer 45 of the third epitaxial stack 40 may include a semiconductor material that may emit blue light. A third p-type contact electrode 45*p* is provided on the p-type semiconductor layer 45 of the third epitaxial stack 40.

The second epitaxial stack 30 includes a p-type semiconductor layer 35, an active layer 33, an n-type semiconductor layer 31 sequentially disposed from bottom to top. The p-type semiconductor layer 35, the active layer 33, and the n-type semiconductor layer 31 of the second epitaxial stack 30 may include a semiconductor material that may emit green light. A second p-type contact electrode 35*p* is provided under the p-type semiconductor layer 35 of the second epitaxial stack 30.

The first epitaxial stack 20 includes a p-type semiconductor layer 25, an active layer 23, and an n-type semiconductor layer 21 sequentially disposed from bottom to top. The p-type semiconductor layer 25, the active layer 23, and the n-type semiconductor layer 21 of the first epitaxial stack 20 may include a semiconductor material that may emit red light. A first p-type contact electrode 25*p* may be provided under the p-type semiconductor layer 25 of the first epitaxial stack 20.

A first n-type contact electrode 21*n* may be provided on the n-type semiconductor layer 21 of the first epitaxial stack 20. The first n-type contact electrode 21*n* may be made of a single-layered metal or a multi-layered metal. For example, the first n-type contact electrode 21*n* may be formed with various materials including metal, such as Al, Ti, Cr, Ni, Au, Ag, Sn, W, Cu, or alloys thereof.

In the illustrated exemplary embodiment, the first to third p-type contact electrodes 25*p*, 35*p*, and 45*p* may be made of a transparent conductive material to transmit light.

In the illustrated exemplary embodiment, a common line may be connected to the n-type semiconductor layers 21, 31, and 41 of the first to third epitaxial stacks 20, 30, and 40. The common line is a wire to which a common voltage is applied. In addition, light emitting signal lines may be connected to the p-type semiconductor layers 25, 35, and 45 of the first to third epitaxial stacks 20, 30, and 40 through the p-type contact electrodes 25*p*, 35*p*, and 45*p*, respectively. In particular, a common voltage Sc is applied to the first n-type contact electrode 21*n* and the second and third n-type semiconductor layers 31 and 41 through the common line, and light emission signals are applied to the p-type contact electrodes 25*p*, 35*p*, and 45*p* of the first to third epitaxial stacks 20, 30, and 40 through the light emission signal lines, respectively, to control light emission of the first to third epitaxial stacks 20, 30, and 40. In this case, the light emission signals include first to third light emission signals $S_R$, $S_G$, and $S_B$ corresponding to each of the first to third epitaxial stacks 20, 30, and 40. In an exemplary embodiment, the first emission signal $S_R$ may be a signal corresponding to light emission of the red light, the second emission signal $S_G$ may be a signal corresponding to light emission of the green light, and the third emission signal $S_B$ may be a signal corresponding to light emission of the blue light.

According to the above-described exemplary embodiment, the first to third epitaxial stacks 20, 30, and 40 are driven depending on the light emission signals applied to the epitaxial stacks. More particularly, the first epitaxial stack 20 is driven depending on the first emission signal $S_R$, the second epitaxial stack 30 is driven depending on the second emission signal $S_G$, and the third epitaxial stack 40 is driven depending on the third light emission signal $S_B$. The first, second, and third emission signals $S_R$, $S_G$, and $S_B$ are independently applied to the first to third epitaxial stacks 20, 30, and 40, and thus, each of the first to third epitaxial stacks 20, 40 may be driven independently. In this manner, the light emitting stack structure may provide various colors and various amounts of light by the combination of the first to third lights emitted downwardly from the first to third epitaxial stacks 20, 30, and 40.

In the above-described exemplary embodiment, although the common voltage is described as being provided to the n-type semiconductor layers 21, 31, and 41 of the first to third epitaxial stacks 20, 30, and 40, and the light emission signals are described as being applied to the p-type semiconductor layers 25, 35, and 45 of the first to third epitaxial stacks 20, 30, and 40, respectively, the inventive concepts are not limited thereto. For example, in some exemplary embodiments, the common voltage may be provided to the p-type semiconductor layers 25, 35, and 45 of the first to third epitaxial stacks 20, 30, and 40, and the light emission signals may be applied to the n-type semiconductor layers 21, 31, and 41 of the first to third epitaxial stacks 20, and 40.

When the light emitting stack structure having the above structure according to an exemplary embodiment implements colors, different lights may not be implemented on different planes spaced apart from each other, but some of the different lights may be provided in an overlapping area to provide miniaturizing and integration of the light emitting device. According to an exemplary embodiment, when light emitting devices implementing different lights are stacked and partially overlapped one over another in one area, full color may be implemented in a significantly smaller area than a conventional light emitting device. As such, it is possible to manufacture a high resolution device even in a small area. In addition, in the light emitting stack structure having the above structure, when the epitaxial stacks emitting light having the same wavelength band are stacked, rather than epitaxial stacks emitting light having the different wavelength bands, the intensity of light emitted from the light emitting device may be controlled in various ways.

In the light emitting stack structure according to an exemplary embodiment, after multiple epitaxial stacks are sequentially stacked on one substrate, a contact part may be formed on the multiple epitaxial stacks through a minimal process, and a wire is connected thereto. In addition, according to an exemplary embodiment, one light emitting stack structure may be mounted, rather than a plurality of light emitting devices as used in a conventional manufacturing method a display device, in which light emitting devices of individual colors are separately manufactured and mounted. As such, the manufacturing method according to an exemplary embodiment becomes remarkably simple.

The light emitting device according to an exemplary embodiment may be implemented in various forms, one of which will be described with reference to FIGS. 2A and 2B.

Figure 2A:
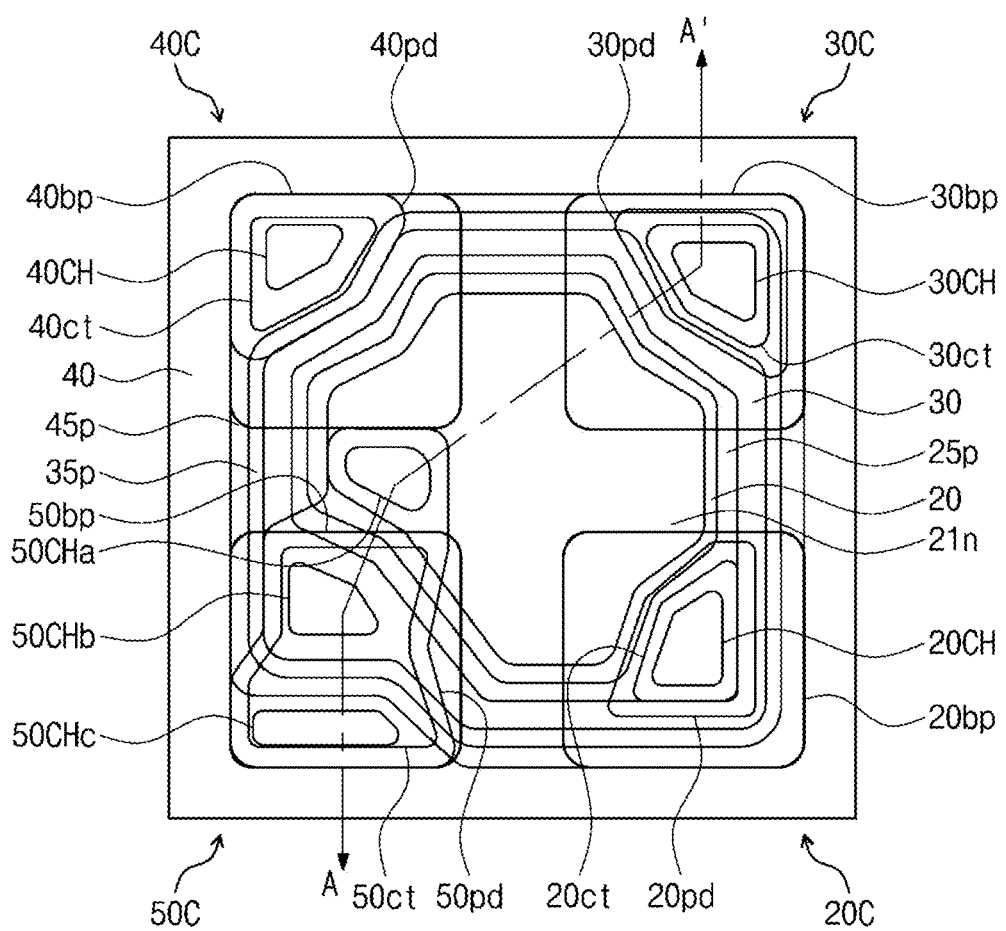
FIG. 2A is a plan view illustrating a light emitting device according to an exemplary embodiment.
Figure 2B:
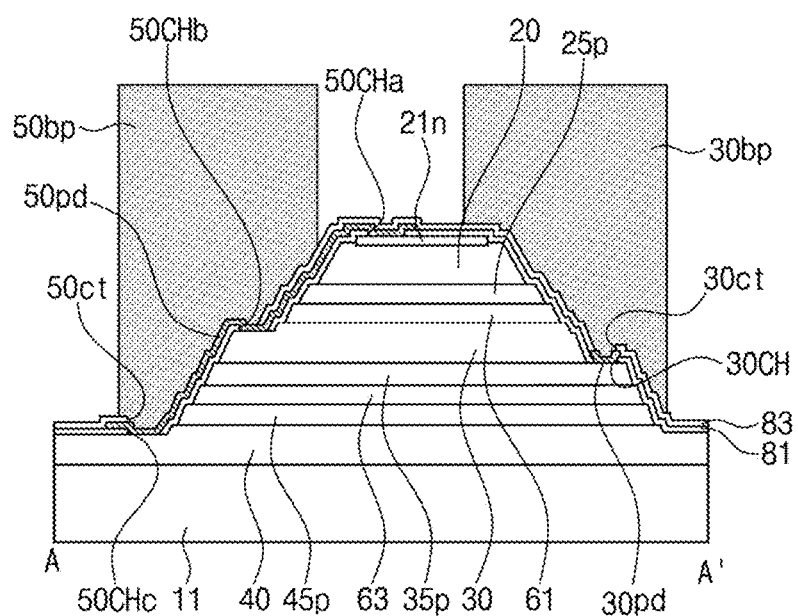
FIG. 2B is a cross-sectional view taken along line A-A' of FIG. 2A.
Figure 3A:
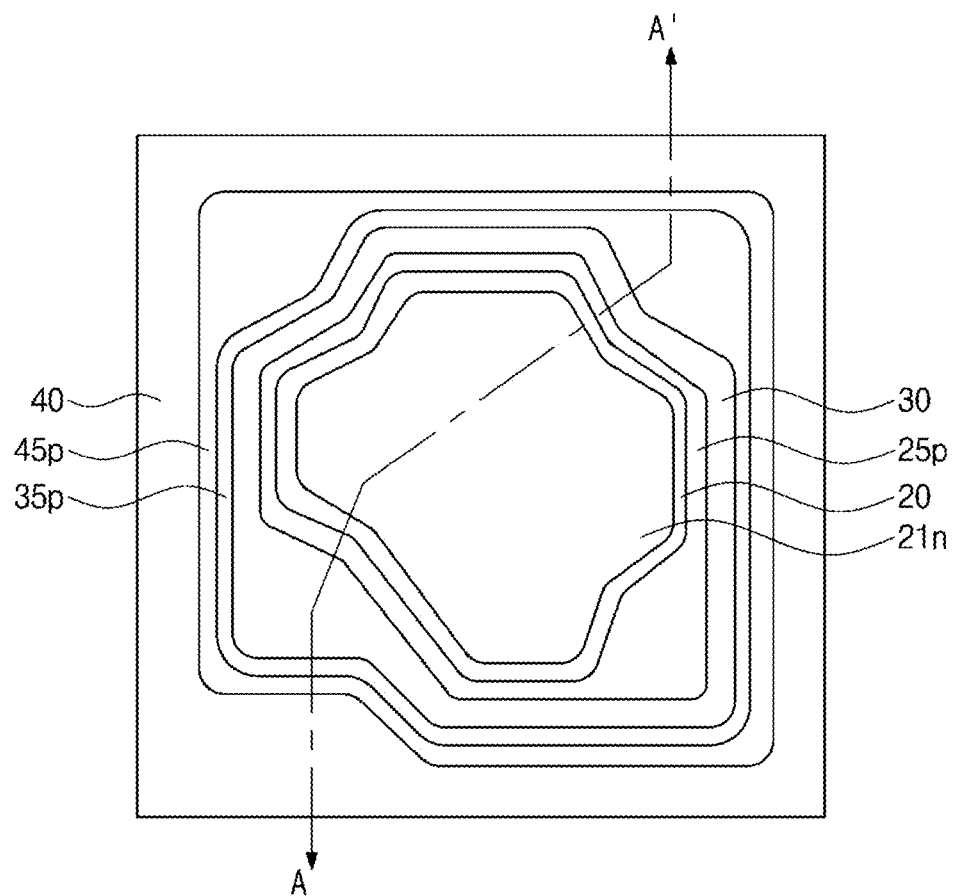
FIGS. 3A, 3B, 4A, 4B, 5A, 5B, 6A, 6B, 7A, and 7B sequentially illustrate a method of manufacturing a light emitting device according to an exemplary embodiment. In particular.
Figure 3B:
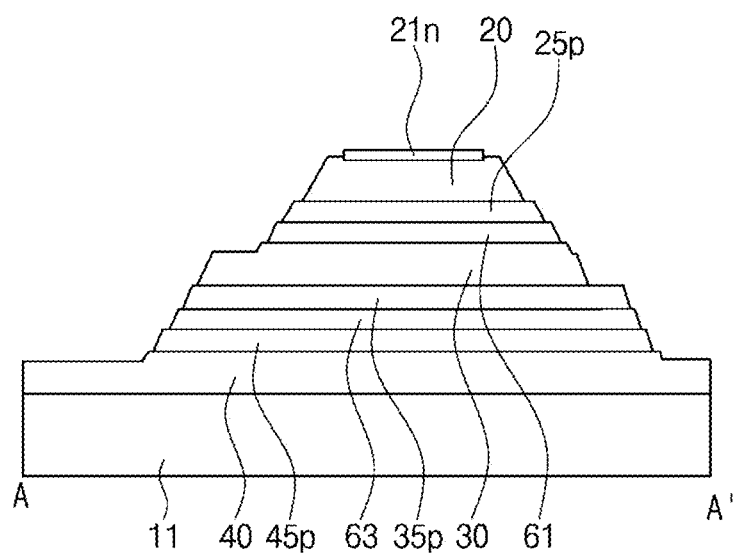
Figure 4A:
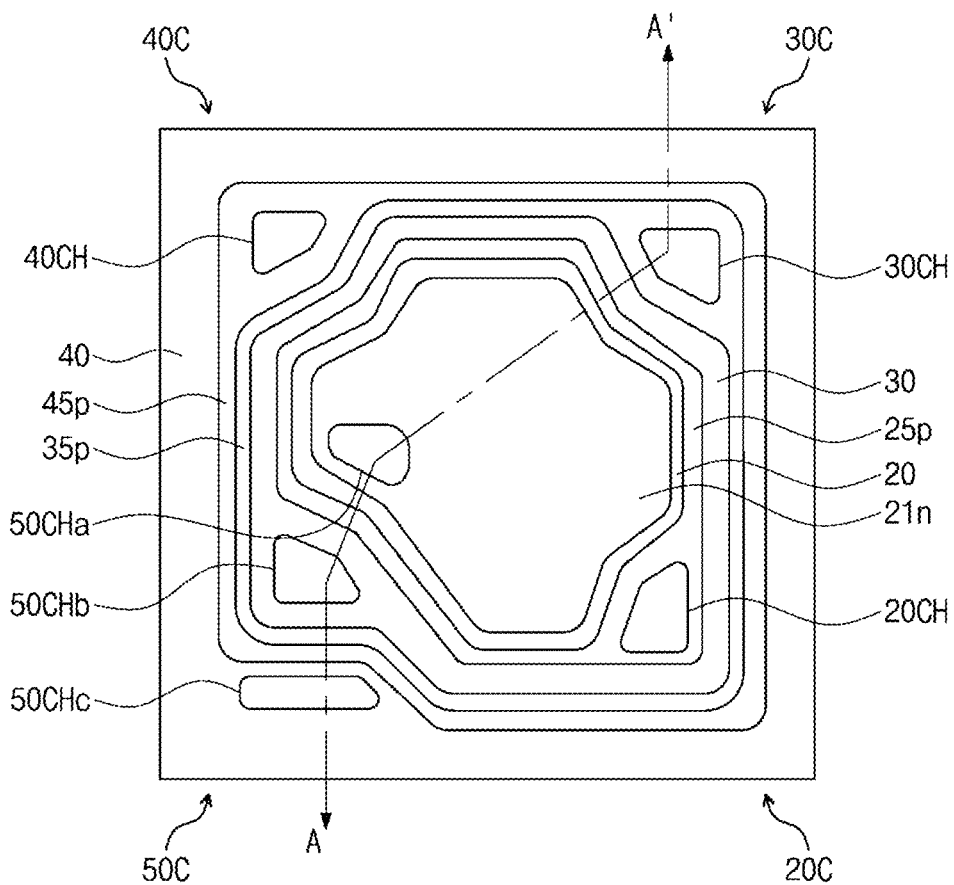
Figure 4B:
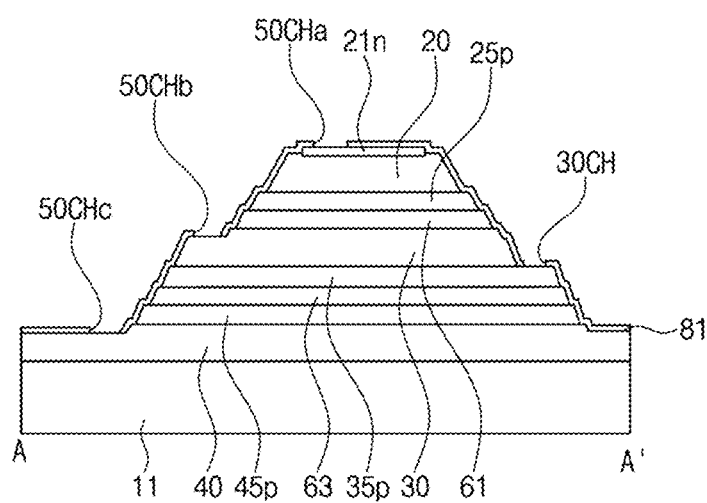

FIG. 2A is a plan view illustrating a light emitting device according to an exemplary embodiment, and FIG. 2B is a cross-sectional view taken along line A-A' of FIG. 2A.

Referring to FIGS. 2A and 2B, a light emitting device according to an exemplary embodiment includes the substrate 11, a light emitting structure provided on the substrate and including a plurality of epitaxial stacks, and bump electrodes 20*bp*, 30*bp*, 40*bp*, 50*bp* provided on the light emitting structure. The light emitting structure includes the third epitaxial stack 40, the second epitaxial stack 30, and the first epitaxial stack 20 stacked on the substrate 11.

Each of the first to third epitaxial stacks 20, 30, and 40 includes the p-type semiconductor layer, the n-type semiconductor layer, and the active layer provided between the p-type semiconductor layer and the n-type semiconductor layer. In the drawing, the n-type semiconductor layer, the p-type semiconductor layer, and the active layer of each epitaxial stack are exemplarily illustrated as one epitaxial stack.

A third p-type contact electrode 45*p*, the second adhesive layer 63, and a second p-type contact electrode 35*p* are sequentially provided on the third epitaxial stack 40. The second p-type contact electrode 35*p* may be in direct contact with the second epitaxial stack 30.

The first adhesive layer 61 and a first p-type contact electrode 25*p* are sequentially provided on the second epitaxial stack 30. The first p-type contact electrode 25*p* may be in direct contact with the first epitaxial stack 20.

The first n-type contact electrode 21*n* is provided on the first epitaxial stack 20. The first n-type semiconductor layer 21 may have a structure, in which a portion of an upper surface thereof is recessed, and the first n-type contact electrode 21*n* may be provided in the recessed portion.

A single-layered or multi-layered insulating layer is provided on the substrate 11 on which the first to third epitaxial stacks 20, 30, and 40 are stacked. In an exemplary embodiment, a first insulating layer 81 and a second insulating layer 83 may be provided on a portion of side surfaces and upper surfaces of the first and third epitaxial stacks 20, 30 and 40 to cover a stack structure of the first to third epitaxial stacks 20, 30 and 40. The first and/or second insulating layers 81 and 83 may be made of various organic/inorganic insulating materials, and the materials and shapes thereof are not limited. For example, the first and/or second insulating layers 81 and 83 may be provided as a silicon oxide layer, a silicon nitride layer, an aluminum oxide layer ($Al_2O_3$) or distributed Bragg reflectors (DBRs). In addition, the first and/or second insulating layers 81 and 83 may be black organic polymer films.

A contact part is provided in the pixel to connect a wiring part to the first to third epitaxial stacks 20, 30, and 40. The contact part includes a first contact part 20C for providing a light emission signal to the first epitaxial stack 20, a second contact part 30C for providing a light emission signal to the second epitaxial stack 30, a third contact part 40C for providing a light emission signal to the third epitaxial stack 40, and a fourth contact part 50C for applying the common voltage to the first to third epitaxial stacks 20, 30, and 40. In an exemplary embodiment, the first to fourth contact parts 20C, 30C, 40C, and 50C may be provided at various positions in plan view.

The first to fourth contact parts 20C, 30C, 40C, and 50C may include first to fourth pads 20*pd*, 30*pd*, 40*pd*, and 50*pd* and the first to fourth bump electrodes 20*bp*, 30*bp*, 40*bp*, and 50*bp*, respectively.

Each of the first to fourth pads 20*pd*, 30*pd*, 40*pd*, and 50*pd* is spaced apart from one another to be insulated from each other.

Each of the first to fourth bump electrodes 20*bp*, 30*bp*, 40*bp*, and 50*bp* may be insulated from and spaced apart from one another, and may be provided in an area overlapping the first to third epitaxial stacks 20, 30, and 40, such as a light emission area thereof. Each of the first to fourth bump electrodes 20*bp*, 30*bp*, 40*bp*, and 50*bp* may be formed over an edge of each of the first to third epitaxial stacks 20, 30, and 40, thereby covering the side surfaces of the active layers of the first to third epitaxial stacks 20, 30, and 40.

The first contact part 20C includes the first pad 20*pd* and the first bump electrode electrically connected to each other. The first pad 20*pd* is provided on the first p-type contact electrode 25*p* of the first epitaxial stack 20, and is connected to the first p-type contact electrode 25*p* through a first contact hole 20CH provided in the first insulating layer 81. The first bump electrode 20*bp* at least partially overlaps the first pad 20*pd*. The first bump electrode 20*bp* is connected to the first pad 20*pd* through a first through hole 20*ct* in a region overlapping the first pad 20*pd* with the second insulating layer 83 interposed therebetween.

The second contact part 30C includes the second pad 30*pd* and the second bump electrode 30*bp* electrically connected to each other. The second pad 30*pd* is provided on the second p-type contact electrode 35*p*, and is connected to the second p-type contact electrode 35*p* through a second contact hole 30CH formed in the first insulating layer 81. The second bump electrode 30*bp* at least partially overlaps the second pad 30*pd*. The second bump electrode 30*bp* is connected to the second pad 30*pd* through a second through hole 30*ct* in a region overlapping the second pad 30*pd* with the second insulating layer 83 interposed therebetween.

The third contact part 40C includes the third pad 40*pd* and the third bump electrode 40*bp* electrically connected to each other. The third pad 40*pd* is provided on the third p-type contact electrode 45*p*, and is connected to the third p-type contact electrode 45*p* through a third contact hole 40CH formed in the first insulating layer 81. The third bump electrode 40*bp* at least partially overlaps the third pad 40*pd*. The third bump electrode 40*bp* is connected to the third pad 40*pd* through a third through hole 40*ct* in a region overlapping the third pad 40*pd* with the second insulating layer 83 therebetween.

The fourth contact part 50C includes the fourth pad 50*pd* and the fourth bump electrode 50*bp* electrically connected to each other. The fourth pad 50*pd* is connected to the first to third epitaxial stacks 20, 30, and 40 through first to third sub contact holes 50CHa, 50CHb, and 50CHc, which are respectively provided on the first n-type contact electrode 21*n*, the second and third n-type semiconductor layers of the first to third epitaxial stacks 20, 30, and 40, respectively. An upper surface of the third epitaxial stack 40 may be partially removed to expose the third n-type semiconductor layer, such that the fourth pad 50*pd* is connected to the third n-type semiconductor layer of the third epitaxial stack 40.

In particular, the fourth pad 50*pd* is connected to the first epitaxial stack 20 through a first sub contact hole 50CHa provided on the first n-type contact electrode of the first epitaxial stack 20, is connected to the second epitaxial stack 30 through a second sub contact hole 50CHb provided on the second n-type semiconductor layer of the second epitaxial stack 30, and is connected to third epitaxial stack 40 through a third sub contact hole 50CHc provided on the third n-type semiconductor layer of the third epitaxial stack 40. The fourth bump electrode at least partially overlaps the fourth pad 50*pd*. The fourth bump electrode 50*bp* is connected to the fourth pad 50*pd* through a fourth through hole 50*ct* in a region overlapping the fourth pad 50*pd* with the second insulating layer 83 interposed therebetween.

Figure 5A:
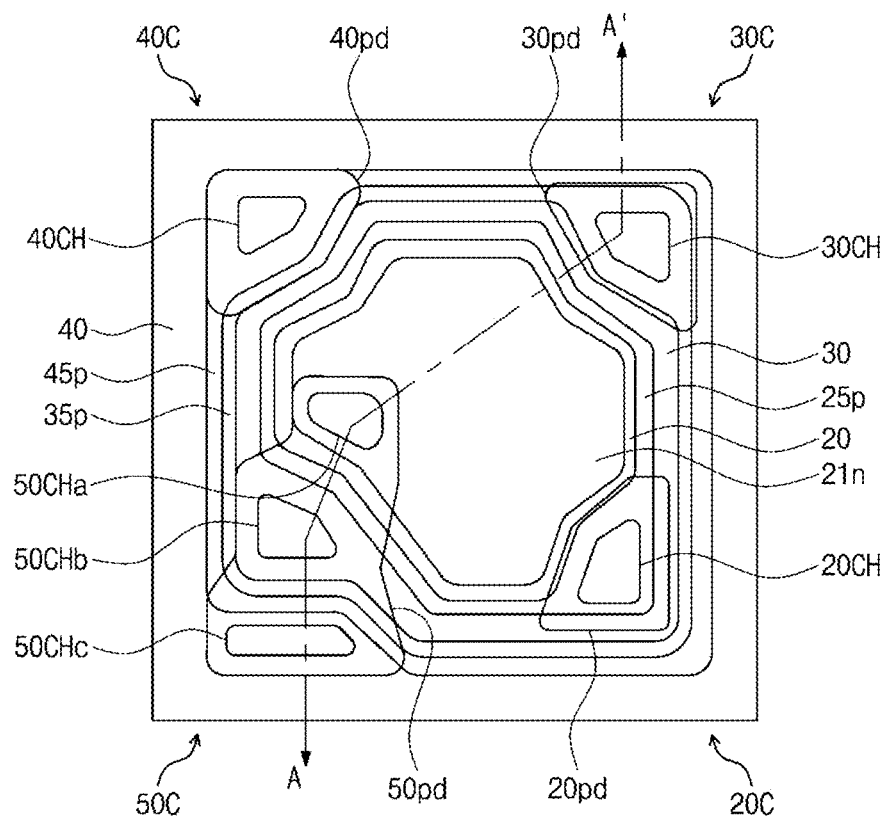
Figure 5B:
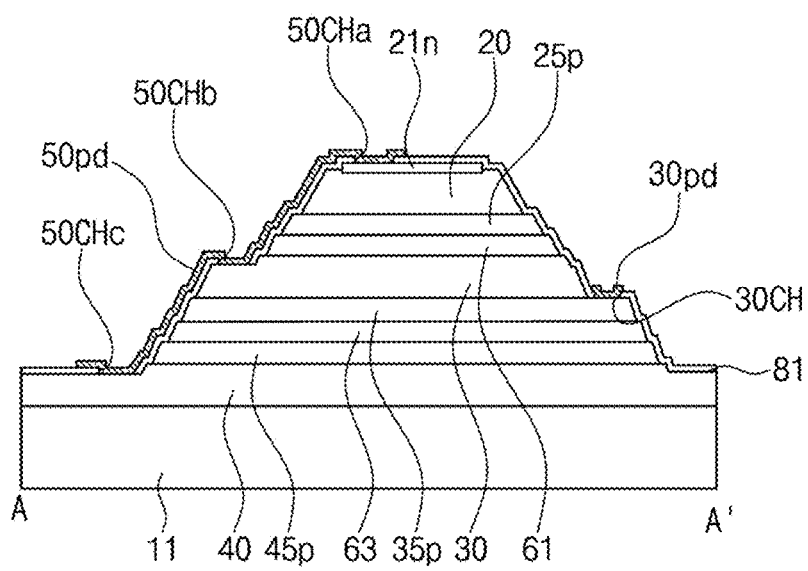
Figure 6A:
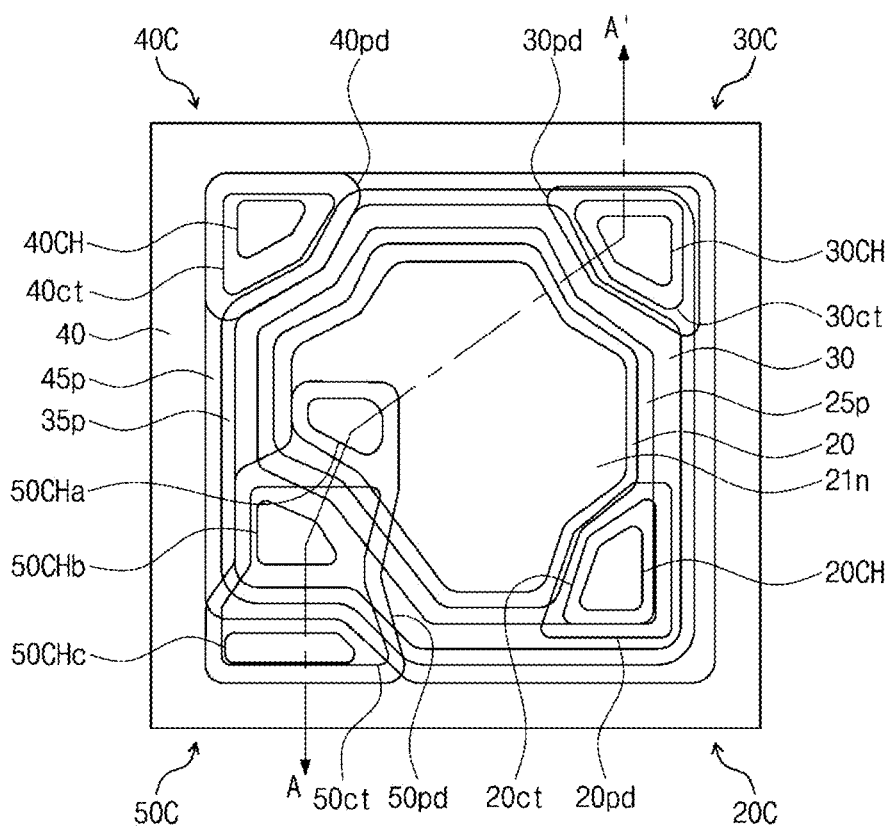
Figure 6B:
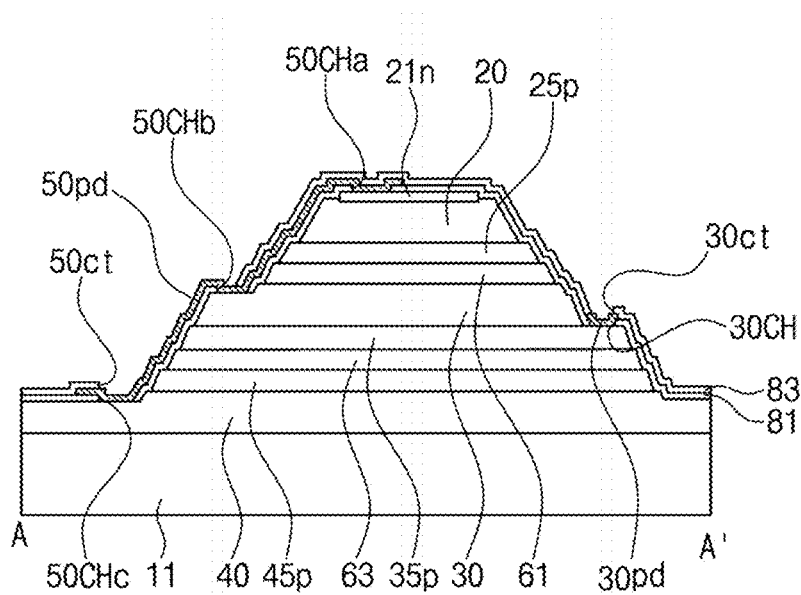
Figure 7A:
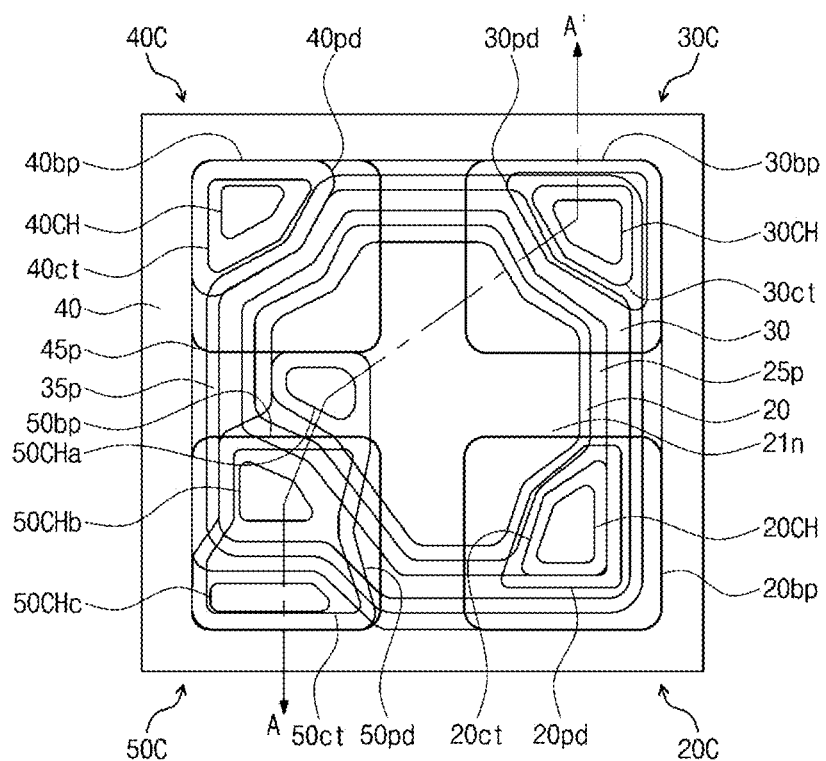
Figure 7B:
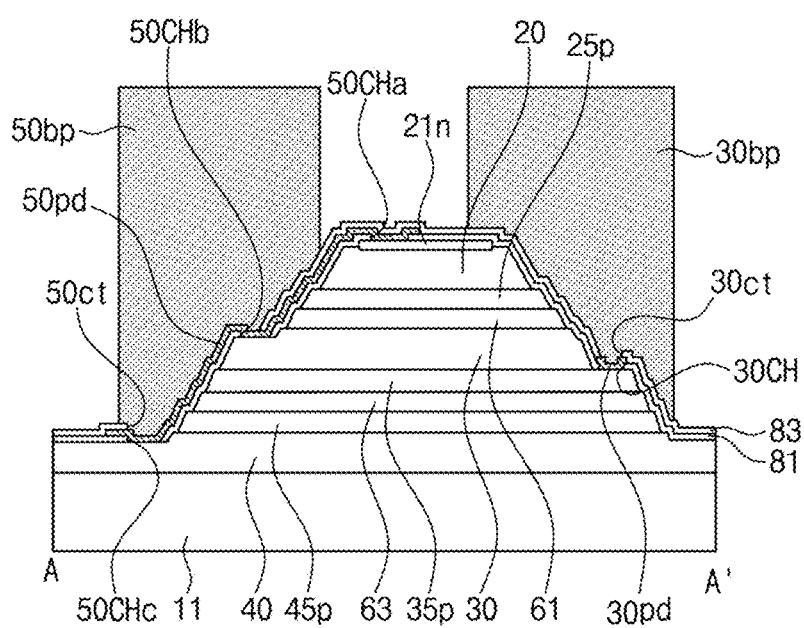

In an exemplary embodiment, the wiring part provided to correspond to the first to fourth contact parts 20C, 30C, 40C, and 50C, and electrically connected to the first to fourth bump electrodes 20*bp*, 30*bp*, 40*bp*, and 50*bp*, respectively (see FIG. 5), and/or a driving device such as a thin film transistor connected to the wiring part may be further provided in the substrate 11. For example, the first to third epitaxial stacks 20, 30, 40 may be connected to first to third light emission signal lines providing the light emission signals to the first to third epitaxial stacks 20, 30, and 40 through the first to third bump electrodes 20*bp*, 30*bp*, and 40*bp*, respectively, and a common line providing the common voltage to each of the first to third epitaxial stacks 20, 30, and 40 through the fourth bump electrode 50*bp*. In the illustrated exemplary embodiment, the first to third light emitting signal lines may correspond to first to third scan lines, and the common line may correspond to a data line, respectively.

FIGS. 3A to 7B sequentially illustrate a method of manufacturing a light emitting device according to an exemplary embodiment. In particular, FIGS. 3A, 4A, 5A, 6A, and 7A are plan views, and FIGS. 3B, 4B, 5B, 6B, and 7B are cross-sectional views taken along line A-A' of FIGS. 3A, 4A, 5A, 6A, and 7A, respectively.

Referring to 3A and 3B, a light emitting structure is formed on the substrate 11. In the light emitting structure, the third epitaxial stack 40, the third p-type contact electrode 45*p*, the second adhesive layer 63, the second p-type contact electrode 35*p*, the second epitaxial stack 30, the adhesive layer 61, the first p-type contact electrode 25*p*, the first epitaxial stack 20, and the first n-type contact electrode 21*n* may be sequentially formed by various methods, such as chemical vapor deposition, metal organic chemical vapor deposition, and molecular beam deposition.

The light emitting structure may be patterned in various shapes in consideration of an overall wire connection structure. For example, the contact holes, through holes, and pads may be formed in a polygonal shape when viewed in plan view.

According to an exemplary embodiment, the first to third epitaxial stacks 20, 30, and 40 and the first to third p-type contact electrodes 25*p*, 35*p*, and 45*p* may be partially removed through an etching process to expose upper surfaces thereof to which the first and fourth contact holes 20CH, 30CH, 40CH, and 50CH (see FIGS. 4A and 4B) are to be formed.

Referring to 4A and 4B, the first insulating layer 81 may be formed conformally on the vertically stacked light emitting structure. The first insulating layer 81 may include an oxide, for example, silicon oxide and/or silicon nitride.

The first insulating layer 81 is patterned to remove a portion thereof, thereby forming the first to fourth contact holes 20CH, 30CH, 40CH, and 50CH.

The first contact hole 20CH is disposed on the first p-type contact electrode 25*p* to partially expose the first p-type contact electrode 25*p*. The second contact hole 30CH is disposed on the second epitaxial stack 30 to partially expose the second p-type contact electrode 35*p*. The third contact hole 40CH is disposed on the third p-type contact electrode 45*p* to partially expose the third p-type contact electrode 45*p*. The fourth contact hole 50CH includes the first to third sub contact holes 50CHa, 50CHb and 50CHc, and the first to third sub contact holes 50CHa, 50CHb and 50CHc are disposed on the first n-type contact electrode 21*n*, the second n-type semiconductor layer of the second epitaxial stack 30, and the third n-type semiconductor layer of the third epitaxial stack 40, respectively, to partially expose the first n-type contact electrode 21*n*, the second n-type semiconductor layer of the second epitaxial stack and the third n-type semiconductor layer of the third epitaxial stack 40.

Referring to 5A and 5B, the first to fourth pads 20*pd*, 30*pd*, 40*pd*, and 50*pd* are formed on the first insulating layer 81 on which the first to fourth contact holes 20CH, 30CH, and 50CH are formed. Various conductors including metal may be used as a conductive film material for forming the first to fourth pads 20*pd*, 30*pd*, 40*pd*, and 50*pd*. For example, the first to fourth pads 20*pd*, 30*pd*, 40*pd*, and 50*pd* may include at least one of Ni, Ag, Au, Pt, Ti, At, Al and Cr.

The first to fourth pads 20*pd*, 30*pd*, 40*pd*, and 50*pd* are formed to partially overlap portions where the first to fourth contact holes 20CH, 30CH, 40CH, and 50CH are formed, respectively. The fourth pad 50*pd* may be formed to generally overlap a portion where the first to third sub contact holes 50CHa, 50CHb, and 50CHc are formed.

Referring to 6A and 6B, the second insulating layer 83 may be formed conformally on the first insulating layer 81. The second insulating layer 83 may include an oxide, for example, silicon oxide and/or silicon nitride.

The second insulating layer 83 is patterned to remove a portion thereof, and thus, the first to fourth through holes 20*ct*, 30*ct*, 40*ct*, and 50*ct* are formed.

The first to fourth through holes 20*ct*, 30*ct*, 40*ct*, and 50*ct* are disposed on the first to fourth pads 20*pd*, 30*pd*, 40*pd*, and 50*pd*, respectively, to partially expose the first to fourth pads 20*pd*, 30*pd*, 40*pd*, and 50*pd*.

Referring to 7A and 7B, the first to fourth bump electrodes 20*bp*, 30*bp*, 40*bp*, and are formed on the second insulating layer 83, on which the first to fourth through holes 30*ct*, 40*ct*, and 50*ct* are formed.

The first to fourth bump electrodes 20*bp*, 30*bp*, 40*bp*, and 50*bp* are formed to overlap with portions where the first to fourth through holes 20*ct*, 30*ct*, 40*ct*, and 50*ct* are formed, respectively. As such, the first to fourth bump electrodes 20*bp*, 30*bp*, 40*bp*, and 50*bp* are connected to the first to fourth pads 20*pd*, 30*pd*, 40*pd*, and 50*pd* through the first to fourth through holes 20*ct*, 30*ct*, 40*ct*, and 50*ct*, respectively.

Each of the first to fourth bump electrodes 20*bp*, 30*bp*, 40*bp*, and 50*bp* may have a larger area than the corresponding first to fourth pads 20*pd*, 30*pd*, 40*pd*, and 50*pd*. In addition, the first to fourth bump electrodes 20*bp*, 30*bp*, 40*bp*, and 50*bp* may at least partially overlap the light emission region from which the first to third epitaxial stacks 20, 30 and 40 emit light.

The first to fourth bump electrodes 20*bp*, 30*bp*, 40*bp*, 50*bp* may be formed by a plating method using various metals. The first to fourth bump electrodes 20*bp*, 30*bp*, 40*bp*, and may further include a seed layer for forming a metal layer in the plating process. As the seed layer, various metals, for example, metal including Cu, Ni, Ti, and the like may be used, which may be variously changed depending on the metal material to be plated.

When the first to fourth bump electrodes 20$bp$, 30$bp$, 40$bp$, and 50$bp$ are formed by the plating method, it is possible to form a flat upper surface on each of the first to fourth bump electrodes 20$bp$, 30$bp$, 40$bp$, and 50$bp$. The light emitting structure may have an upper step due to etching to form a contact structure for connection with an external wire, and thus, when connecting to another device and when a general metal layer is formed, it may be difficult to make an electrical connection between another device and the light emitting structure due to the step. However, when the first to fourth bump electrodes 20$bp$, 30$bp$, 40$bp$, and 50$bp$ formed by the plating method, it is possible to form electrodes having a flat top surface even on the light emitting structure including the epitaxial layer having a severe step. In addition, while the plated first to fourth bump electrodes 20$bp$, 30$bp$, 40$bp$, and 50$bp$ may have a flat top surface, an additional polishing process may be performed on the upper surfaces of the first to fourth bump electrodes 20$bp$, 30$bp$, 40$bp$, and 50$bp$ to increase the flatness.

The material of the first to fourth bump electrodes 20$bp$, 30$bp$, 40$bp$, and 50$bp$ may be not particularly limited, as long as it can be used as a wiring material in a semiconductor device. For example, the first to fourth bump electrodes 20$bp$, 30$bp$, 40$bp$, and 50$bp$ may be formed of, metal, such as CuAg, Sb, Ni, Zn, Mo, Co, and the like and/or metal alloys thereof. In an exemplary embodiment of the inventive concept, the first to fourth bump electrodes 20$bp$, 40$bp$, 50$bp$ may be made of only Sn, or may be made of Cu/Ni/Sn. When the first to fourth bump electrodes 20$bp$, 30$bp$, 40$bp$, and 50$bp$ are made of Cu/Ni/Sn, internal diffusion of impurities into the light emitting structure may be minimized, and in particular, Cu used as a material of the bump electrodes may prevent penetration of Sn into the light emitting structure.

The first to fourth bump electrodes 20$bp$, 30$bp$, 40$bp$, and 50$bp$ may be formed using the plating method, and then an additional heat treatment process, that is, a reflow process, may be performed to increase the strength of the first to fourth bump electrodes 20$bp$, 30$bp$, 40$bp$, and 50$bp$.

In an exemplary embodiment, the light emitting device having the structure as described above may be implemented as a package and mounted on another device, for example, a printed circuit board to function as one light emitting device package. Accordingly, various wires may be additionally provided to have a structure that facilitates mounting process to other devices.

Figure 8A:
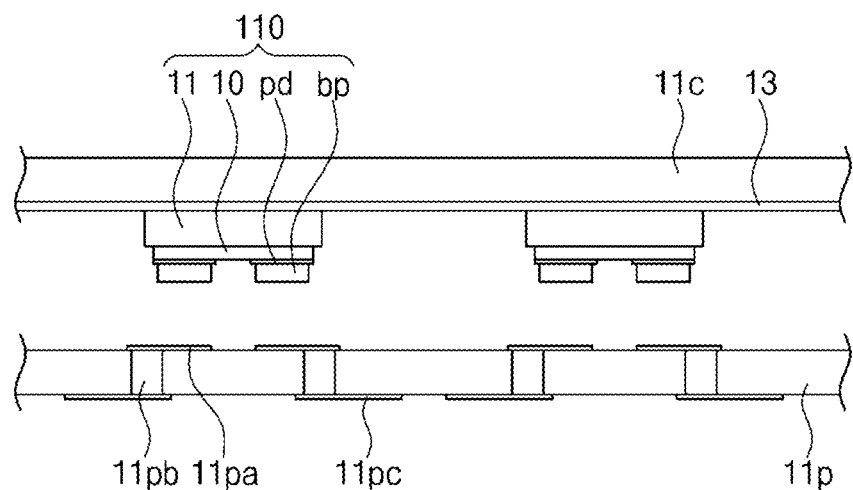
FIGS. 8A, 8B, 8C, 8D, and 8E sequentially illustrate a method of manufacturing a light emitting device package according to an exemplary embodiment.
Figure 8B:
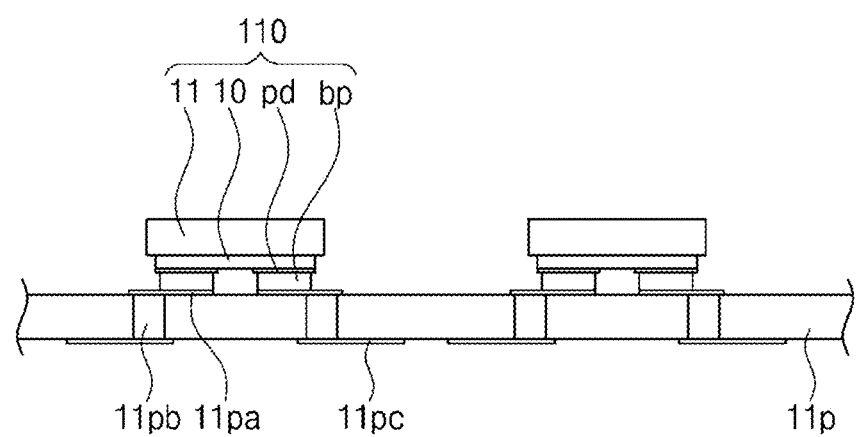
Figure 8C:
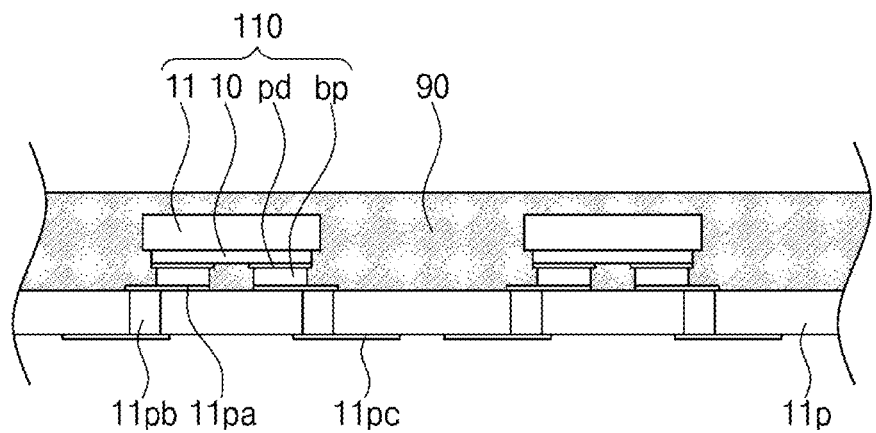
Figure 8D:
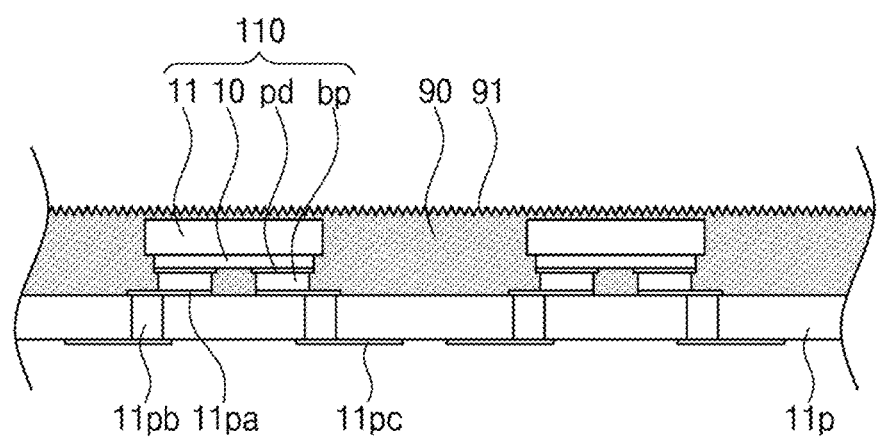
Figure 8E:
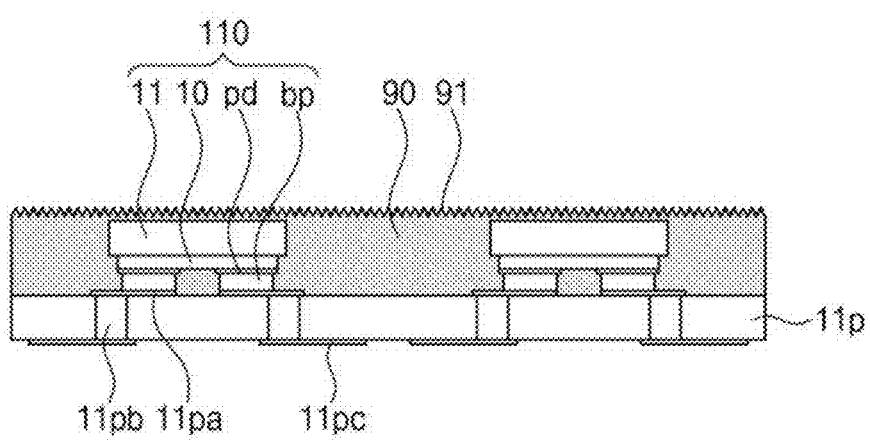

FIGS. 8A to 8E sequentially illustrate a method of manufacturing a light emitting device package. In FIGS. 8A and 8E, the first to third epitaxial stacks are exemplarily illustrated as a light emitting structure 10 and the first to fourth pads and the first to fourth bump electrodes are exemplarily illustrated as a pad "pd" and a bump electrode "bp". In particular, in the drawings, the light emitting structure 10 is exemplarily illustrated as being simply flat, but has a step and/or a slope on the upper surface thereof as described above.

In an exemplary embodiment, at least one light emitting device 110 may be mounted on a printed circuit board 11$p$ having a wire or the like to form the light emitting device package. The light emitting device package may include a plurality of light emitting devices 110.

Referring to FIG. 8A, the printed circuit board 11$p$ is prepared and the plurality of light emitting devices 110 are disposed on the printed circuit board 11$p$.

The printed circuit board 11$p$ may be formed with wires and electrodes for electrical connection between various devices, and at least one light emitting device 110 may be mounted on a surface of the printed circuit board 11$p$. The printed circuit board 11$p$ may be provided in various forms depending on an arrangement of the wires. According to the illustrated exemplary embodiment, the electrodes are provided on a front surface, a rear surface, and a portion between the front surface and the rear surface of the substrate 11. However, the arrangement of the wires of the printed circuit board 11$p$ is not limited thereto. In an exemplary embodiment, the printed circuit board 11$p$ may or may not have flexibility.

In an exemplary embodiment, the printed circuit board 11$p$ has the front surface and the rear surface. Upper electrodes 11$pa$ are provided on the front surface of the printed circuit board 11$p$, lower electrodes 11$pc$ are provided on the rear surface, and via electrodes 11$pb$ penetrate the printed circuit board 11$p$ to connect the upper electrodes 11$pa$ and the lower electrodes 11$pc$. The front surface of the printed circuit board 11$p$ is a surface on which the light emitting devices 110 are mounted. In an exemplary embodiment of the inventive concept, the upper electrodes 11$pa$ of the printed circuit board 11$p$ are formed at positions corresponding to the bump electrodes bp of each light emitting device 110 to be attached later.

The surfaces of the wires and/or the electrodes on the printed circuit board 11$p$ may be treated with electroless nickel immersion gold (ENIG). For example, in an exemplary embodiment, in particular, the surfaces of the upper electrodes 11$pa$ may be treated with ENIG. When the wires and/or the electrodes on the printed circuit board 11$p$ are treated with ENIG, the wires and/or the electrodes may partially melt at a high temperature to facilitate connection to the bump electrodes bp of the light emitting devices 110.

The light emitting devices 110 are attached on a carrier substrate 11$c$ to be disposed on the printed circuit board 11$p$. The carrier substrate 11$c$ is for transporting the light emitting devices 110. An adhesive layer 13 is formed on one surface of the carrier substrate 11$c$, and the light emitting devices 110 are attached to the carrier substrate 11$c$ by the adhesive layer 13. The adhesive layer 13 may be a silicon-based polymer having strong heat resistance and capable of detaching the light emitting devices 110. The adhesive layer 13 may be manufactured in a tape or sheet form, and may be provided on a rear surface of the carrier substrate 11$c$. The adhesive layer 13 has an adhesive strength to stably attach the light emitting devices 110 to the carrier substrate 11$c$, while allowing the light emitting devices 110 be easily detached therefrom when the light emitting devices 110 are attached to the printed circuit board 11$p$. In particular, the adhesive strength of the adhesive layer 13 to the light emitting devices 110 may be less than an adhesive strength between the light emitting devices 110 and the printed circuit board 11$p$.

The light emitting devices 110 may be attached on the rear surface of the carrier substrate 11$c$ in an inverted form, such that the substrate 11 is positioned above the light emitting structure 10. More particularly, the light emitting device 110 attached to the carrier substrate 11$c$ has the inverted form, such that the rear surface of the substrate 11 is attached to the adhesive layer 13 on the carrier substrate 11$c$. The light emitting devices 110 are spaced apart from each other on the printed circuit board 11p while being attached to the carrier substrate 11c.

Referring to FIG. 8B, the light emitting devices 110 are attached on the printed circuit board 11p, and the carrier substrate 11c and the adhesive layer 13 are removed. The light emitting devices 110 attached to the carrier substrate 11c may be compressed downwardly, such that the bump electrodes bp may be in contact with the corresponding upper electrodes 11pa of the printed circuit board 11p. The pressing operation may be performed at a high temperature, and thus, the upper electrodes 11pa on the printed circuit board 11p may be partially melt to be connected to the bump electrodes bp of the light emitting devices 110. The carrier substrate 11c may be then removed, and the adhesive layer 13 on the carrier substrate 11c may have a weaker adhesive strength than the adhesive strength between the bump electrodes bp of the light emitting devices 110 and the upper electrodes 11pa of the printed circuit board 11p to facilitate the separation of the carrier substrate 11c from the light emitting devices 110.

The above-described bump electrodes bp are attached to the upper electrodes 11pa of the printed circuit board 11p, and thus, an overall structure may include the printed circuit board 11p, the bump electrodes bp, the pads pd, the light emitting structure 10, and the substrate 11 sequentially disposed one over another. Light from the light emitting structure 10 travels from the light emitting structure 10 in a direction toward the rear surface of the substrate 11 (a upward direction in the drawing), and thus, light may be mitted towards a direction to which the front surface of the printed circuit board 11p faces.

Referring to FIG. 8C, a molding layer 90 is formed on the printed circuit board 11p on which the light emitting devices 110 are mounted. The molding layer 90 has characteristics of at least partially transmitting the light, but partially reflects, scatters, and/or absorbs external light. The molding layer 90 at least partially covers the light emitting device 110 and partially reflects, scatters, and/or absorbs external light in various directions to prevent the external light from reflecting in a specific direction, in particular, a direction which is visible to a user. In addition, the molding layer 90 at least partially covers the light emitting device 110 to prevent damage to the light emitting device 110 from moisture and/or physical impact from the outside, thereby increasing the reliability of the light emitting device 110.

The molding layer 90 may allow some external light to be reflected, scattered, and/or absorbed in various directions. In particular, the molding layer 90 may have a black color, without being limited thereto. In some exemplary embodiments, the molding layer 90 may have a color other than the black color, as long as some external light can be reflected, scattered, and/or absorbed in various directions to prevent the reflection of the external light toward the user.

For preventing reflection of the external light in the specific direction, the molding layer 90 at least partially surrounds the light emitting device 110. In particular, the molding layer 90 is formed to cover the rear surface of the substrate 11 in the light emitting device 110. In an exemplary embodiment, the molding layer 90 is formed to cover the rear surface of the substrate 11, and thus, light from the outside may be prevented from being reflected by the rear surface of the substrate 11 towards the user. For preventing reflection of the external light in the specific direction, the molding layer 90 may reflect, scatter, or absorb about 50% or more of the external light in various directions. In an exemplary embodiment, the molding layer 90 may reflect, scatter or absorb about 80% or more of external light.

The molding layer 90 may be formed to have a thickness capable of being transmissive, and thus, light emitted from the light emitting structure 10 toward the rear direction (i.e., the upward direction) of the substrate 11 may be maximally emitted. For example, the molding layer 90 may be formed to a thickness through which at least 50% of light from the light emitting structure is transmitted when provided on the rear surface of the light emitting structure and may be provided to have a thickness less than about 100 micrometers in height from the rear surface of the light emitting structure. Alternatively, the molding layer 90 may be provided to have the height less than the thickness of the light emitting device from the rear surface of the light emitting structure.

The molding layer 90 may be not only formed on the rear surface of the substrate 11, but also on the side surface of the light emitting device 110, that is, may cover the side surface of the substrate 11 and side surface of the light emitting structure 10. The molding layer also covers the side surface of the light emitting device 110, and thus, light emitted through the side surface of the light emitting device 110 may be at least partially absorbed by the molding layer 90. Accordingly, the molding layer 90 may prevent light emitted from one light emitting structure 10 from being mixed with light emitted from adjacent light emitting structure 10.

In an exemplary embodiment, the molding layer 90 may be made of an organic polymer, which absorbs light among organic polymers. In an exemplary embodiment, the molding layer 90 may or may not further include an organic/inorganic filler therein in addition to the organic polymer. For example, when the molding layer 90 includes a filler, the filler may be an inorganic filler. Various inorganic fillers may be used, for example, silica, alumina, or the like.

In addition, the molding layer 90 is filled in at least a portion between the light emitting structure 10 and the printed circuit board 11p. More particularly, the molding layer 90 may fill an empty space between the light emitting structure 10 provided with the bump electrodes bp and the printed circuit board 11p. The space between the light emitting structure 10 and the printed circuit board 11p may be filled with the molding layer 90, and thus, the molding layer 90 may effectively dissipate heat generated from the light emitting structure 10, thereby improving heat dissipation characteristics of the light emitting devices 110.

In an exemplary embodiment, the molding layer 90 may be manufactured in various ways, such as a lamination method, a coating method, a chemical vapor deposition method, a printing method, a transfer molding method, or the like. The manufacturing of the molding layer 90 may include an additional process to planarize the surface of the molding layer and various thinning processes may be used. For example, for planarization of the surface of the molding layer 90, squeegeeing may performed to a material of the molding layer 90, or pressurized planarization may be performed using a flat plate, after application before curing. In addition, polishing or lapping may be performed on the surface after the molding layer 90 material is cured.

In one exemplary embodiment, the molding layer 90 is formed by the transfer molding method to obtain a flat upper surface of the molding layer 90. The transfer molding method may be performed through extrusion molding, in which a unit of a package including a light emitting device is provided on a molding die, and then be press-molded with resin liquefied in a solid state into the mold.

A laminating method for planarizing the surface of the molding layer 90 may be a vacuum laminate method performed in a vacuum. In this case, the molding layer 90 may be formed of an organic polymer sheet having a film shape. The organic polymer sheet may be disposed on the printed circuit board 11p on which the light emitting devices 110 are mounted, and then may be heated and pressed under a vacuum condition to form the molding layer 90. The organic polymer sheet may partially show fluidity at high temperature and high pressure, and may fill the area between the light emitting devices 110 and the space between the light emitting devices 110 and the printed circuit board 11p due to the fluidity. The organic polymer sheet is then cured.

In an exemplary embodiment, the molding layer 90 may be formed by a vacuum lamination method to obtain a flat top surface of the molding layer 90. In general, an organic polymer material is applied and then is cured to form the molding layer. In this case, a difference in the height of the top surface of the molding layer 90 may be caused between a region where the light emitting devices 110 are mounted and a region where the light emitting devices 110 are not mounted. The difference in the upper surface height causes non-uniformity of light emitted from the light emitting devices 110. However, according to an exemplary embodiment, the upper surface of the molding layer 90 is flat to increase the uniformity of light regardless of the positions of the light emitting devices 110.

In addition, the molding layer 90 may be provided to stably hold the light emitting devices 110, and thus, the rigidity of the light emitting device package may be increased. In particular, the molding layer 90 may fill the space between the printed circuit board 11p and the light emitting devices 110 to increase the adhesion between the printed circuit board 11p and the light emitting devices 110. Accordingly, the rigidity of the entire light emitting device package is further increased.

Referring to FIG. 8D, the surface of the molding layer 90 is textured to form a fine concavo-convex part 91 on the surface of the molding layer 90, which is exposed to the outside. The fine concavo-convex part 91 generates diffuse reflection. As such, the reflection of external light is further minimized in the user's field of vision due to the diffuse reflection of the external light by the fine concavo-convex part 91. When the light emitting device package is used in a variety of applications, such as lighting or display device, the substrate 11 of the light emitting device is disposed at a position facing the user's line of sight, and thus, it is necessary to prevent light reflected by the substrate 11 as much as possible. Accordingly, the fine concavo-convex part 91 is additionally formed in the molding layer 90 to have light scattering property, light reflecting property, and light absorbing property, thereby reducing glare to the user that may be caused from the reflection of external light.

In an exemplary embodiment, the molding layer 90 may further include a filler, such as silica or alumina therein, and thus, filler particles may be exposed to the surface of the molding layer 90 after texturing. In this case, the filler particles may be randomly exposed on the surface to further improve the scattering degree of external light.

The fine concavo-convex part 91 may be formed in various methods. In an exemplary embodiment, the surface of the molding layer 90 may be etched using plasma.

Figure 9A:
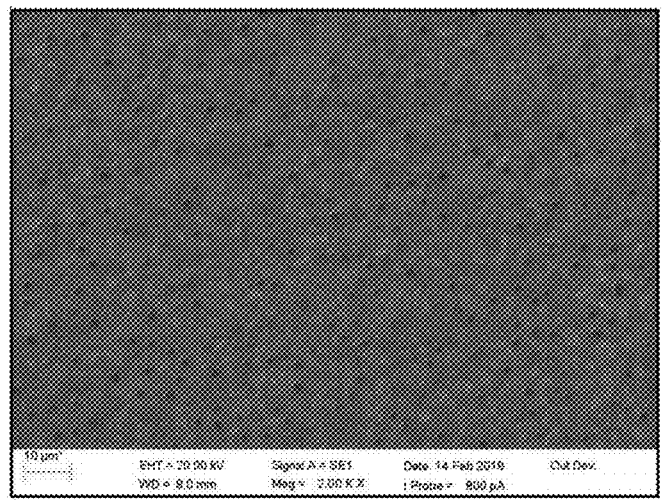
FIGS. 9A and 9B are scanning electron microscope (SEM) photographs illustrating a molding layer with a plasma treatment and a mold layer without the plasma treatment, respectively.
Figure 9B:
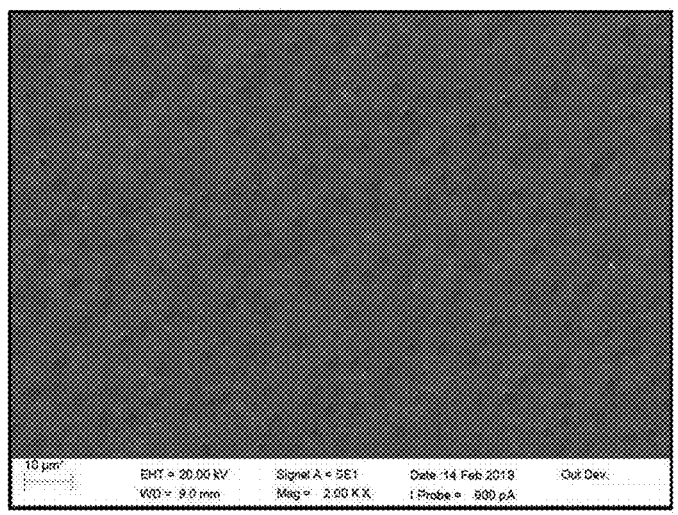

FIGS. 9A and 9B are SEM photographs showing a surface of a molding layer with a plasma treatment, and a surface of a molding layer without the plasma treatment, respectively.

Referring to FIG. 9A, it may be seen that a plurality of fillers are randomly exposed to the outer surface of the molding layer after the plasma treatment. The plurality of fillers may be exposed to the outer surface in various sizes and frequencies, thereby significantly increasing the external light scattering effect on the filler.

On the other hand, referring to FIG. 9B, it may be seen that the number of fillers exposed on the surface is remarkably small when not treated with the plasma treatment, as compared to that of FIG. 9A. Accordingly, it may be seen that the fine concavo-convex part can be easily formed on the surface of the molding layer 90 using the plasma treatment.

In this case, a change in the components of the molding layer 90 is not observed by analyzing the components of the molding layer 90 before or after the plasma treatment, and thus, it may be seen that the fine concavo-convex part can be formed on the molding layer 90 without changes in the components thereof.

In an exemplary embodiment, in addition to the plasma treatment, the fine concavo-convex part may be formed by roughening the surface using a micro sand blaster. In the case of using the micro sand blaster, fine particles of several micrometers to several tens of micrometers may be sprayed at a high pressure on the surface of the molding layer, and the surface of the molding layer may be cleaned by ultrasonic cleaning or the like, and dried to form the fine concavo-convex part on the surface of the molding layer. Alternatively, a method such as dry grinding or wet etching the surface of the molding layer 90 may be used alone or in combination with the above-described method.

According to an exemplary embodiment, fine concavo-convex patterns may be transferred to the surface of the molding layer using an imprint mold having a fine concavo-convex pattern, and thus, the concavo-convex part may be formed on the surface of the molding layer.

FIGS. 10A to 10E are cross-sectional views sequentially illustrating a process of forming a fine concavo-convex part on a surface of a molding layer using an imprint mold according to an exemplary embodiment.

Figure 10A:
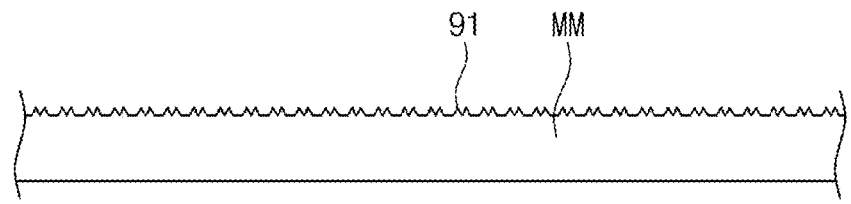
FIGS. 10A, 10B, 10C, 10D, 10E, and 10E are cross-sectional views sequentially illustrating a process of forming a fine concavo-convex part on a surface of a molding layer using an imprint mold according to an exemplary embodiment.

Referring to FIG. 10A, first, a master mold MM is prepared. The master mold MM is formed with a pattern 91 that may form the fine concavo-convex part to be transferred to the surface of the molding layer, and is used to form an inverse pattern on an imprint mold IMP.

Figure 10B:
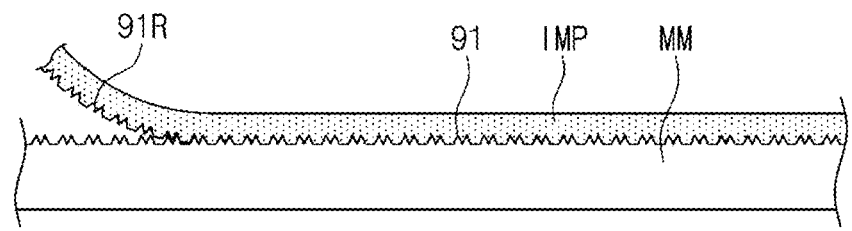

Referring to FIG. 10B, a material of the imprint mold IMP is applied on the master mold MM. The imprint mold IMP is cured, and then the imprint mold IMP is separated from the master mold MM. As such, an inverse pattern 91R of the fine concavo-convex part on the master mold MM is formed on a surface of the imprint mold IMP.

Figure 10C:
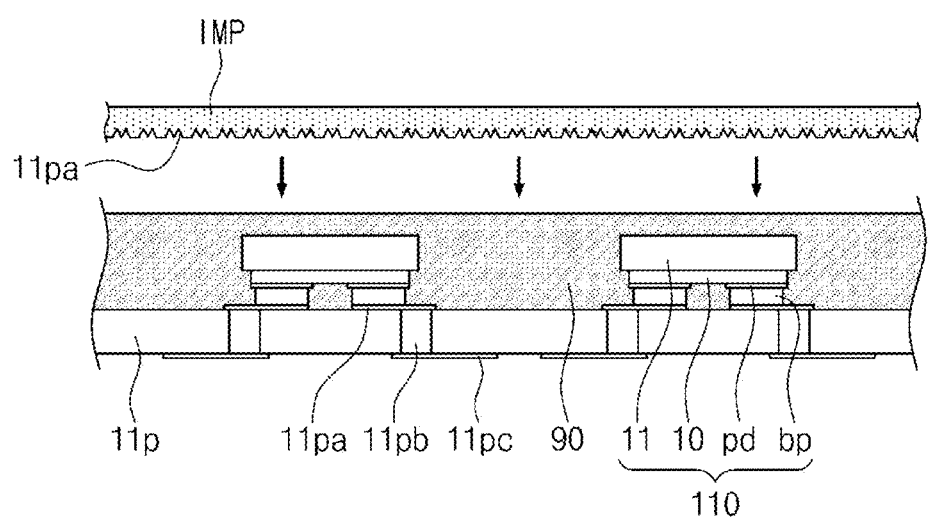

Referring to FIG. 10C, the imprint mold IMP having the inverse pattern 91R is disposed on the molding layer 90 and then pressed from the top to the bottom.

Figure 10D:
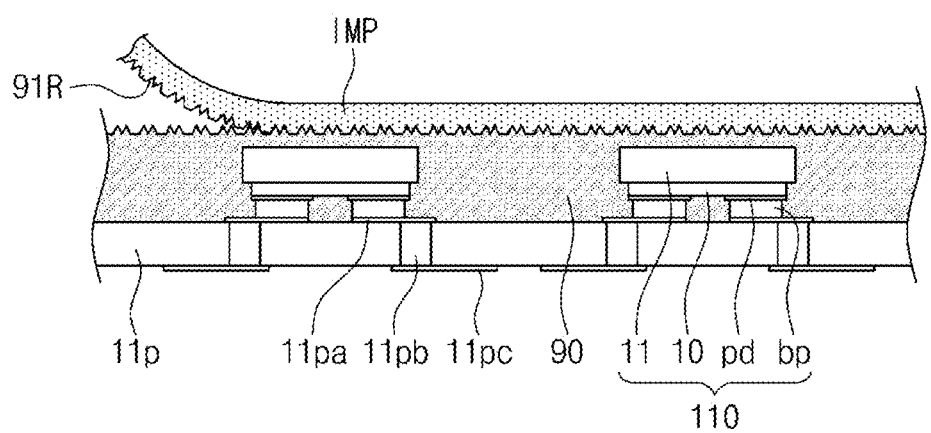

Referring to FIG. 10D, the inverse pattern 91R of the imprint mold IMP is transferred to the upper surface of the molding layer 90 by pressing the imprint mold IMP, and the imprint mold IMP is separated from the molding layer 90 after the transfer.

Figure 10E:
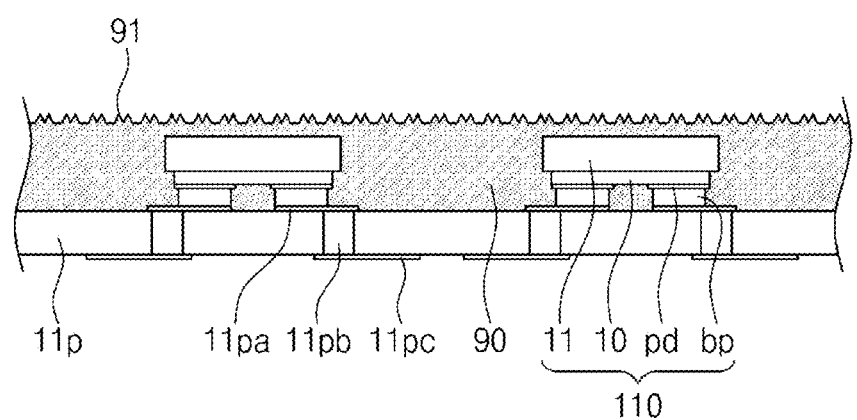

Referring to FIG. 10E, the fine concavo-convex part 91 is formed on the upper surface of the molding layer 90 by removing the imprint mold IMP.

According to illustrated exemplary embodiment, a shape of the fine concavo-convex part formed in the molding layer 90 is determined depending on a shape of the fine concavo-convex pattern formed on the master mold MM. Accordingly, the fine concavo-convex pattern of the master mold MM may be formed to various shapes, as necessary. Accordingly, the shape, density, and the like of the fine concavo-convex part of the molding layer MM may be controlled, and thus, the degree of scattering of external light by the upper surface of the concavo-convex part of the molding layer 90 may be easily adjusted.

Referring back to FIG. 8E, after the molding layer 90 having the fine concavo-convex part is formed, the printed circuit board 11$p$ and the light emitting device 110 are cut into an appropriate size as a light emitting device package. The printed circuit board 11$p$ and the light emitting device 110 may be cut, such that the light emitting device package includes one light emitting device 110 therein, or may be cut to have a large area, such that the light emitting device package includes a plurality of the light devices 110 therein. The number and area of the light emitting device 110 may be cut differently set depending on a device to which the light emitting device 110 are to be mounted.

Figure 11A:
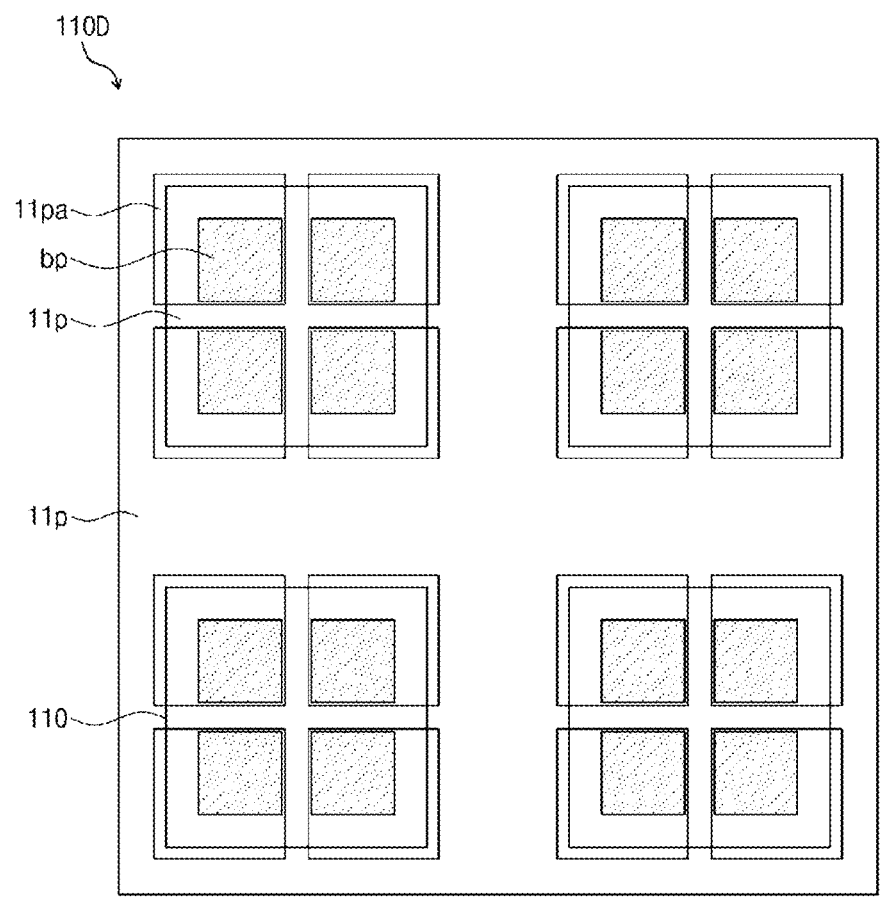
FIG. 11A is a plan view illustrating a light emitting device package according to an exemplary embodiment. In particularly.
Figure 11B:
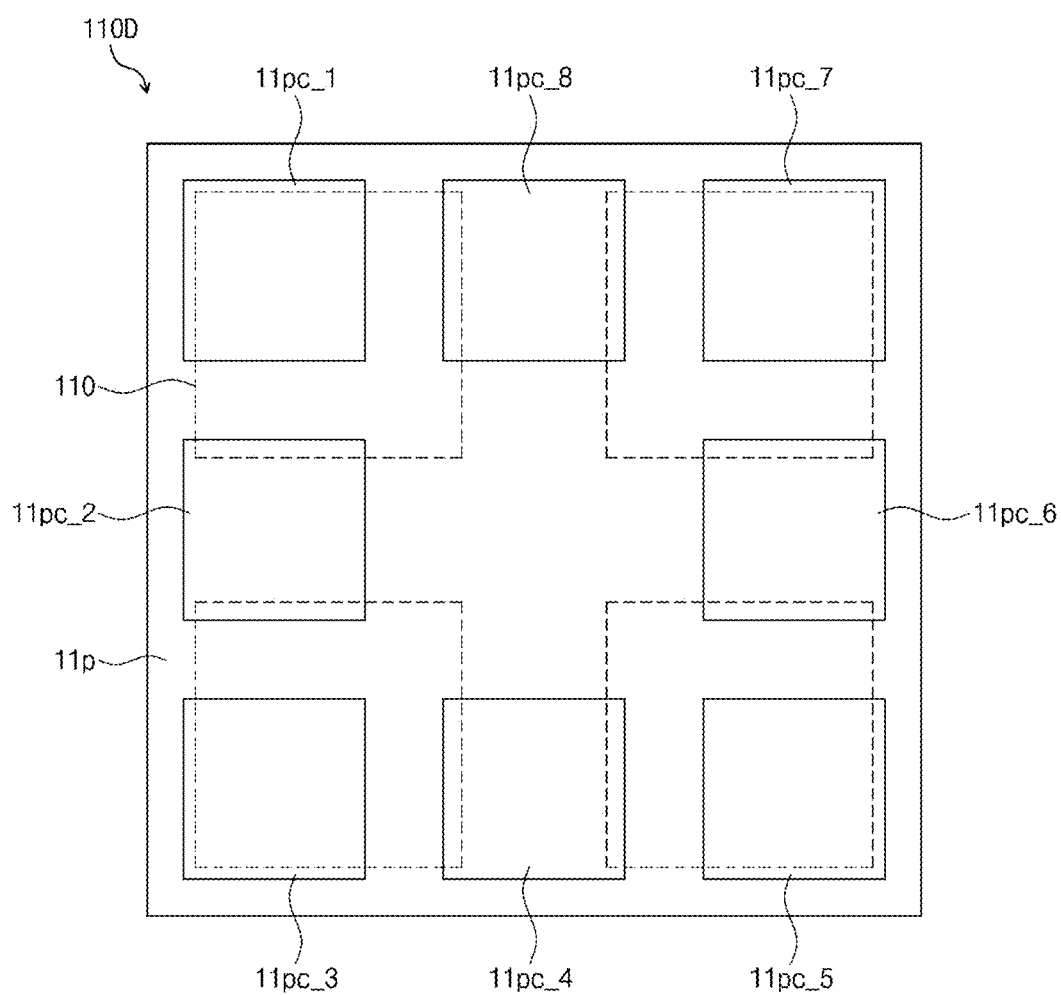
FIG. 11B is a rear view of the light emitting device package illustrated in FIG. 11A.
Figure 12:
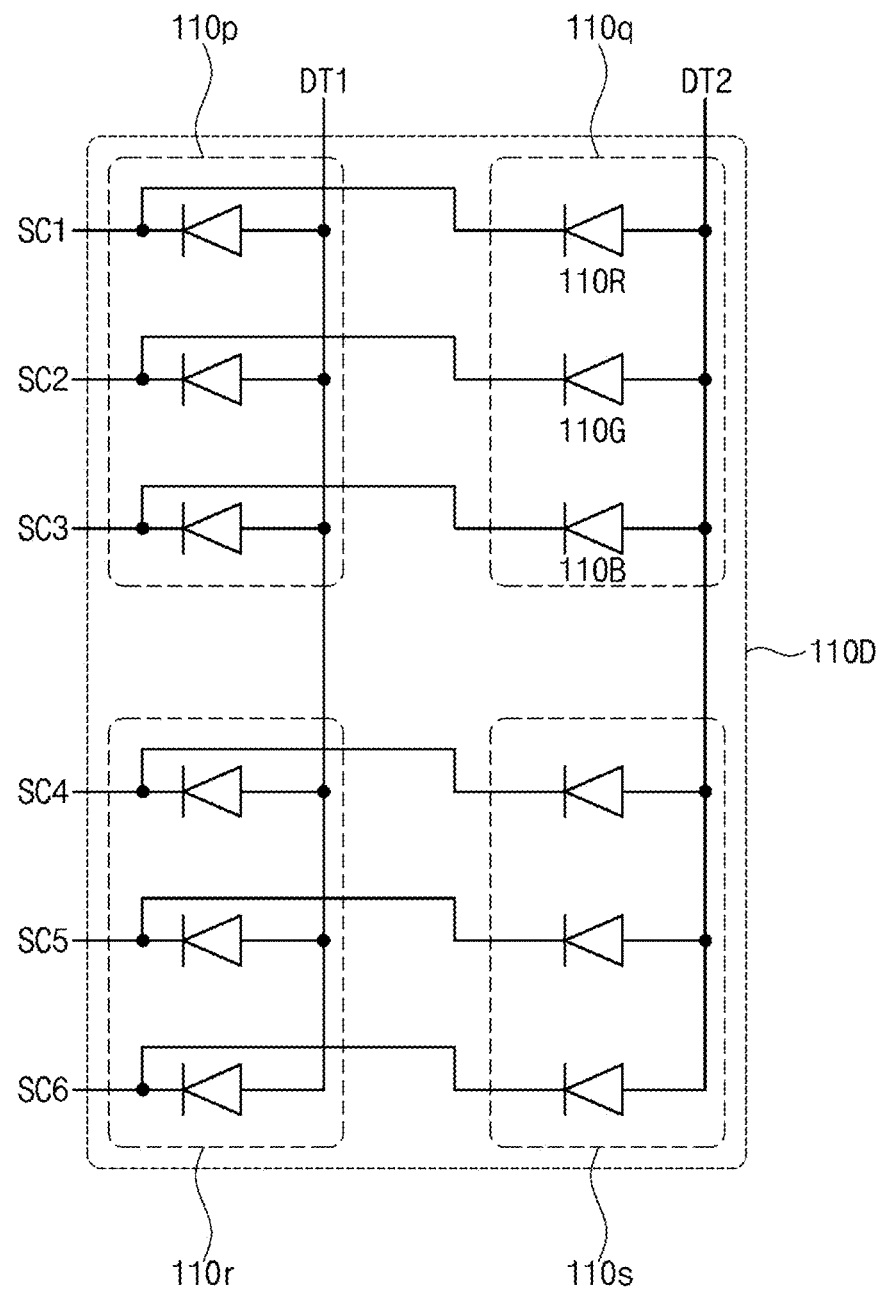
FIG. 12 is a circuit diagram of a light emitting device package illustrated in FIGS. 11A and 11B.

In the light emitting device package, the number of light emitting device mounted on the printed circuit board forming one light emitting device package may be variously changed. FIG. 11A is a plan view illustrating a light emitting device package according to an exemplary embodiment. In particular, FIG. 11A is a top view illustrating four light emitting device mounted in a matrix on a printed circuit board, and FIG. 11B is a rear view of a light emitting device package illustrated in FIG. 11A. FIG. 12 is a circuit diagram of a light emitting device package illustrated in FIGS. 11A and 11B.

Referring to FIGS. 11A, 11B, and 12, a light emitting device package 110D includes the printed circuit board 11$p$ and four light emitting device 110 mounted in a 2×2 arrangement on the printed circuit board 11$p$. However, the number and arrangement of the light emitting device packages 110D is not limited thereto, and may be arranged in various matrix forms, for example, 1×1, 3×3, 4×4, and the like. As described above, each light emitting device 110 has a structure, in which first to third epitaxial stacks are stacked in a vertical direction. Accordingly, each of the first to third epitaxial stacks corresponds to light emitting diodes each generating light. For example, the first to third epitaxial stacks may correspond to the first light emitting diode emitting the red light, the second light emitting diode emitting the green light, and the third diode emitting the blue light, respectively.

Referring to FIG. 12, for driving four light emitting device, first to sixth scan lines SC1, SC2, SC3, SC4, SC5, and SC6, and first and second data lines DT1 and DT2 are connected to the four light emitting device. When the four light emitting device are referred to as first to fourth light emitting device 110$p$, 110$q$, 110$r$, and 110$s$, the first light emitting device 110$p$ is connected to the first to third scan lines SC1, SC2, and SC3 and the first data line D1, the second light emitting device 110$q$ is connected to the first to third scan lines SC1, SC2, and SC3 and the second data line DT2. The third light emitting device 110$r$ is connected to the fourth to sixth scan lines SC4, SC5, and SC6 and the first data line DT1, and the fourth light emitting device 110$s$ is connected to the fourth to six scan lines SC4, SC5 and SC6 and the second data line DT2.

Three light emitting diodes included in each of the first to fourth light emitting device 110$p$, 110$q$, 110$r$, and 110$s$ may each selectively emit light corresponding to a data signal input through the data line when a scan signal is supplied through the scan line. When a voltage higher than a threshold voltage is applied, the diodes are connected between the scan lines and the data lines to emit light with a luminance corresponding to a level of the applied voltage. In particular, a voltage of the scan signal applied to the scan line and/or the data signal applied to the data line may be adjusted to control light emission of each light emitting diode. For example, each light emitting diode emits light at a luminance corresponding to the input data signal during each frame period. The light emitting diodes supplied with the data signal corresponding to black luminance do not emit light during the corresponding frame period to display black.

In an exemplary embodiment, the six scan lines and two data lines may be provided, thereby individually driving the first to fourth light emitting device 110$p$, 110$q$, 110$r$, and 110$s$.

To this end, the light emitting devices are mounted at corresponding positions on the printed circuit board 11$p$. Referring back to FIGS. 11A and 11B, upper electrodes 11$pa$ are provided on the front surface of the printed circuit board 11$p$ at the positions corresponding to the light emitting devices 110, respectively. More particularly, one light emitting device 110 has the four bump electrodes bp, and the four upper electrodes 11$pa$ are provided on the printed circuit board 11$p$ for one light emitting device 110. The four bump electrodes bp of each light emitting device 110 are overlappingly disposed to be connected to the four upper electrodes 11$pa$, respectively.

In an exemplary embodiment, the first to third bump electrodes of the first light emitting device 110 are connected to the first to third scan lines, respectively, and the fourth bump electrode is connected to the first data line. The first to third bump electrodes of the second light emitting device 110 are connected to the first to third scan lines, respectively, and the fourth bump electrode is connected to the second data line. The first to third bump electrodes of the third light emitting device 110 are connected to the fourth to sixth scan lines, respectively, and the fourth bump electrode is connected to the first data line. The first to third bump electrodes of the fourth light emitting device 110 are connected to the fourth to sixth scan lines, respectively, and the fourth bump electrode is connected to the second data line.

Each of eight lower electrodes is disposed on the rear surface of the printed circuit board 11$p$. The eight lower electrodes correspond to first to sixth scan pads providing the scan signal to the first to sixth scan lines, and first and second data pads providing the data signal to the first and second data lines. For example, when the eight lower electrodes formed on the rear surface of the printed circuit board 11$p$ are first to eighth lower electrodes 11$pc\_1$, 11$pc\_2$, 11$pc\_3$, 11$pc\_4$, 11$pc\_5$, 11$pc\_6$, 11$pc\_7$, and 11$pc\_8$, first to sixth lower electrodes 11$pc\_1$ and 11$pc\_2$, 11$pc\_3$, 11$pc\_4$, 11$pc\_5$, and 11$pc\_6$ correspond to the first to sixth scan pads, and the seventh and eighth lower electrodes 11$pc\_7$ and 11$pc\_8$ correspond to the first and second data pads. However, arrangement and order of the first to sixth scan pads and the first and second data pads may be not limited thereto, and may be arranged on the rear surface of the printed circuit board 11$p$ in various shapes and areas, and the order thereof may be set differently.

In an exemplary embodiment, a distance between two lower electrodes adjacent to each other may be greater than a distance between two upper electrodes adjacent to each other. In forming the light emitting device package, the lower electrodes of the printed circuit board may function as connection electrodes for electrical connection with another electronic device when the light emitting device package is mounted on another electronic device, and thus, a gap between the two lower electrodes adjacent to each other is relatively wide. Therefore, the light emitting device package may be more easily mounted on another electronic device.

As described above, the light emitting device package according to an exemplary embodiment may use the printed circuit board of a simple structure, and the light emitting device that can be individually driven may be easily mounted on the printed circuit board. In addition, only eight input terminals (i.e., the eight lower electrodes) may be provided when driving four light emitting devices, and thus, the plurality of light emitting devices may be driven with a simple structure.

According to an exemplary embodiment, the light emitting device package may be applied to another device in various forms, such as a single light emitting device package used as a light source, or a module used as a light source, in which a plurality of light emitting device packages are mounted on a base substrate to be modularized. Examples of devices using the light emitting device package(s) include a display device, a living lighting device, vehicle lighting (vehicle headlights, lighting lamps, taillights, etc.), various decorative lighting devices, and the like.

Figure 13:
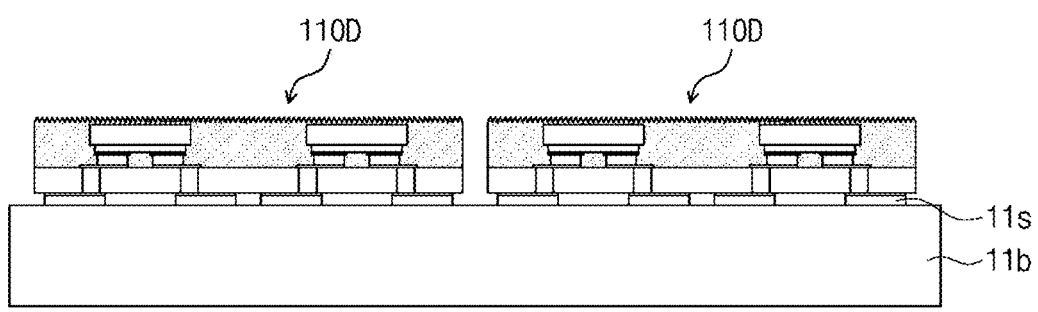
FIG. 13 is a schematic cross-sectional view illustrating a light module by mounting a plurality of light emitting device packages on a base substrate for application to a display device or a vehicle lighting device.

FIG. 13 is a schematic cross-sectional view illustrating a light source module manufactured by mounting the plurality of light emitting device packages 110D on a base substrate 11b for application to a display device or a vehicle lighting device according to an exemplary embodiment.

Referring to FIG. 13, the base substrate 11b having wires may be prepared and the plurality of light emitting device packages 110D may be mounted on the base substrate 11b. The base substrate 11b may or may not have flexibility.

The wires on the base substrate 11b are provided to correspond to the lower electrodes of the light emitting device packages 110D. The wires on the base substrate 11b may be connected to the lower electrodes of the light emitting device package through connection electrodes 11s. In an exemplary embodiment, the connection electrodes 11s may each be provided as a solder.

In the light emitting device packages mounted on the base substrate as illustrated in FIG. 13, when a defect occurs in any one of the light emitting device packages, the defective light emitting device package may be replaced with a good product and be easily repaired.

Figure 14:
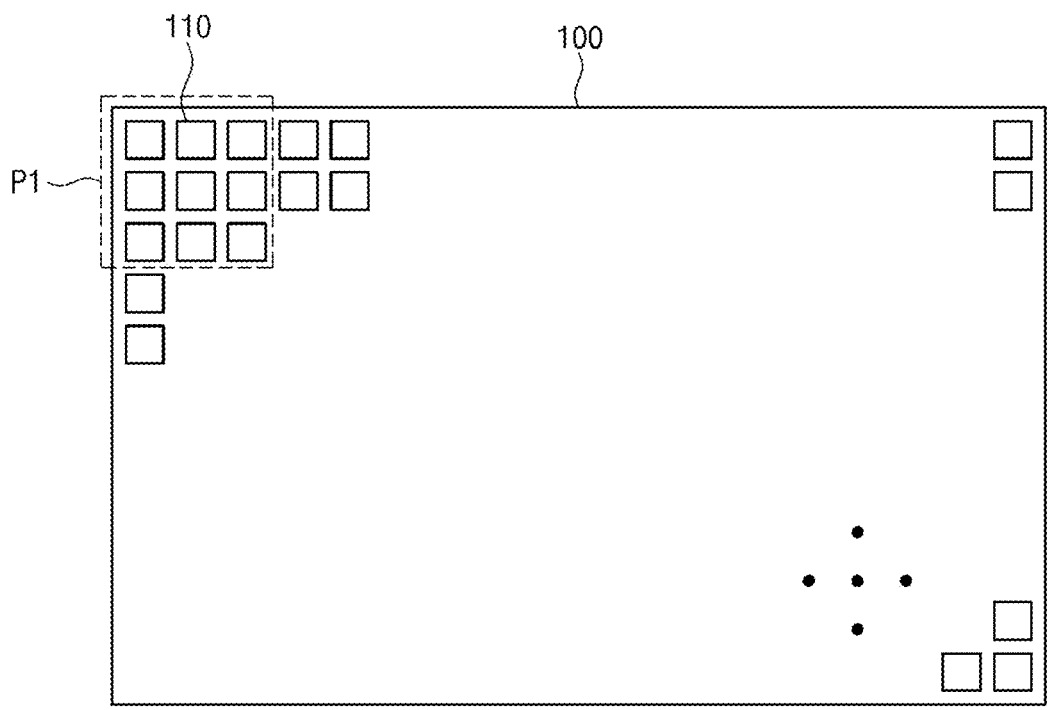
FIG. 14 is a plan view exemplarily illustrating a light emitting device package according to an exemplary embodiment applied to a display device.
Figure 15:
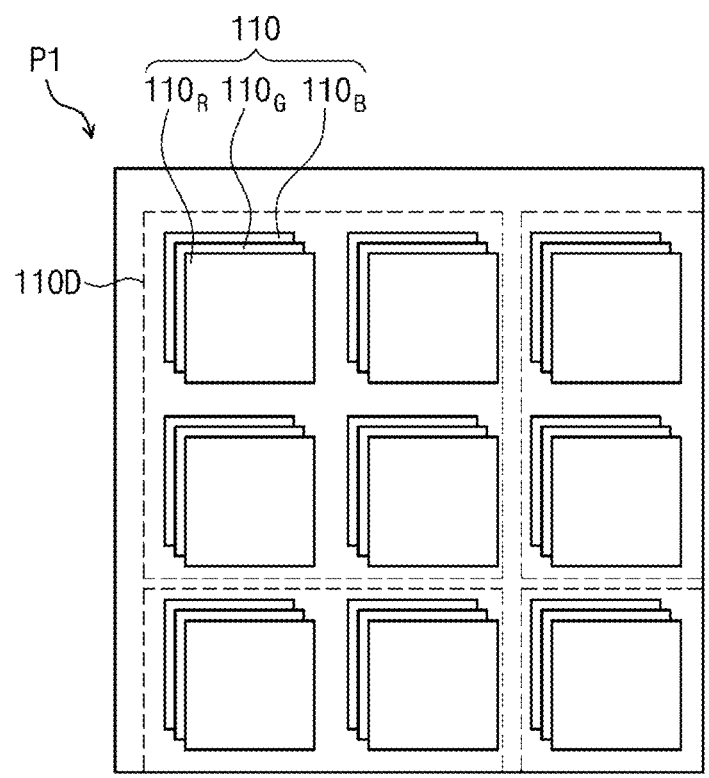
FIG. 15 is an enlarged plan view of portion P1 of FIG. 14.

FIG. 14 is a plan view conceptually illustrating a light emitting device package according to an exemplary embodiment applied to a display device, and FIG. 15 is an enlarged plan view of portion P1 of FIG. 14.

FIGS. 14 and 15, the light emitting device according to an exemplary embodiment may be employed as a pixel in a display device capable of displaying various colors. The plurality of light emitting device may be mounted on a base substrate in a form of the light emitting device packages 110D described above.

A display device 100 according to an exemplary embodiment may display arbitrary visual information, for example, text, video, photographs, two-dimensional or three-dimensional images, and the like.

The display device 100 may be provided in various shapes, for example, a closed polygon including straight sides such as a rectangle, circles and ellipses including sides formed of curves, and semicircle and semi-ellipse including sides of straight lines and curves. In the illustrated exemplary embodiment, the display device is exemplarily shown as having a rectangular shape.

The display device 100 has a plurality of pixels 110 for displaying an image. Each of the pixels 110 may be implemented as one light emitting device as a minimum unit for displaying the image. Each pixel 110 may include a light emitting device having the above-described structure and may emit white light and/or color light.

In an exemplary embodiment, each pixel 110 includes a first pixel $110_R$ which emits red light, a second pixel $110_G$ which emits green light, and a third pixel $110_B$ which emits blue light. The first to third pixels $110_R$, $110_G$, and $110_B$ may correspond to the first to third epitaxial stacks of the light emitting device described above, respectively.

Light emitted from the first to third pixels $110_R$, $110_G$, and $110_B$ is not limited thereto. In addition, at least two pixels 110 may emit light having the same color or may emit light having different colors from each other, for example, may emit light having different colors from that described above, such as yellow, magenta, cyan, and the like.

The pixels 110 are arranged in a matrix shape. As used herein, the arrangement of the pixels 110 in the matrix shape not only refer that the pixels 110 are arranged in an exact line along a row or a column, but also that the pixels 110 are generally arranged along rows or columns and details are capable of being changed, such as arranged in a zigzag pattern.

According to exemplary embodiments, it is possible to easily manufacture lighting devices of various sizes by simply mounting the plurality of light emitting device packages on the base substrate. For example, a large area display device may be easily manufactured using the plurality of light emitting device packages according to exemplary embodiments. In addition, when the base substrate or the printed circuit board is flexible, the display device may also be flexible, and thus, various types of display devices, for example, a rollable display device, a foldable display device, and a curved display device, may be easily manufactured.

According to an exemplary embodiment, the light emitting device package having the simple structure that may be formed by a simple manufacturing method, and a display device including the same are provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
   a printed circuit board having a front surface and a rear surface;
   at least one light source disposed on the front surface and configured to emit light in a direction away from the printed circuit board; and
   a light transmittable material disposed on the printed circuit board and covering the light source,
   wherein the light source includes:
   a light emitter disposed on the printed circuit board;
   an insulation material disposed on the light emitter; and
   bump electrodes configured to electrically connect the light emitter and the printed circuit board,
   wherein the light transmittable material has a groove region formed on a surface of the light transmittable material,
   wherein the bump electrodes are spaced apart from one another and differ in size from one another, and
   wherein the light transmittable material has a first thickness and is configured to transmit light emitted from the light source, the light transmittable material covering the front surface of the printed circuit board extending from an upper surface of the light source.

2. The light emitting device of claim 1, wherein the printed circuit board includes at least two upper electrodes disposed on the front surface, wherein the two upper electrodes are spaced apart from each other.

3. The light emitting device of claim 1, wherein the light emitter includes a first semiconductor layer, a second semiconductor layer, and a third semiconductor layer.

4. The light emitting device of claim 3, wherein the light emitter further includes a first electrode electrically connected to the first semiconductor layer, wherein the first electrode includes a material including at least one of Al, Ti, Cr, Ni, Au, Ag, Sn, W, Cu, or alloys.

5. The light emitting device of claim 3, wherein the light emitter further includes a second electrode electrically connected to the third semiconductor layer, wherein the second electrode is configured to transmit a light emitted from the second semiconductor layer.

6. The light emitting device of claim 1, further comprising a plurality of light sources including the at least one light source arranged on the printed circuit board in a pattern, wherein the pattern is one of a column, a matrix, or a zigzag.

7. A light emitting device comprising:
a printed circuit board having a front surface and a rear surface;
at least one light source disposed on the front surface and configured to emit light in a direction away from the printed circuit board; and
a light transmittable material disposed on the printed circuit board and covering the light source,
wherein the light source includes:
a light emitter disposed on the printed circuit board;
an insulation material disposed on the light emitter; and
bump electrodes configured to electrically connect the light emitter and the printed circuit board,
wherein the bump electrodes differ in size from one another,
wherein the printed circuit board includes at least two upper electrodes disposed on the front surface,
wherein the two upper electrodes are spaced apart from each other,
wherein the light transmittable material has a groove region formed on a surface of the light transmittable material, and
wherein the light transmittable material has a first thickness and is configured to transmit the light emitted from the light source.

8. The light emitting device of claim 7, wherein the bump electrodes are spaced apart from one another.

9. The light emitting device of claim 7, wherein the light transmittable material is configured to change a direction of the light emitted from the light source.

10. The light emitting device of claim 7, wherein the light emitter includes a first semiconductor layer, a second semiconductor layer, and third semiconductor layer.

11. The light emitting device of claim 10, wherein the light emitter further includes a first electrode electrically connected to the first semiconductor layer, wherein the first electrode includes a material including at least one of Al, Ti, Cr, Ni, Au, Ag, Sn, W, Cu, or alloys.

12. The light emitting device of claim 10, wherein the light emitter further includes a second electrode electrically connected to the third semiconductor layer, wherein the second electrode is configured to transmit a light emitted from the second semiconductor layer.

13. A light emitting device comprising:
a printed circuit board having a front surface and a rear surface;
a plurality of light sources configured to emit light in a direction away from the printed circuit board; and
a light transmittable material disposed on the printed circuit board and covering the light sources,
wherein at least one of the light sources includes:
a light emitter disposed on the printed circuit board;
an insulation material disposed on the light emitter; and
bump electrodes configured to electrically connect the light emitter and the printed circuit board,
wherein the bump electrodes are spaced apart from one another and differ in size from one another, and
wherein the insulation material has a first thickness and is configured to transmit the light emitted from the at least one of the light sources.

14. The light emitting device of claim 13, wherein the light transmittable material is configured to change a direction of the light emitted from at least one of the light sources.

15. The light emitting device of claim 13, wherein at least two of the light sources are configured to emit light having different peak wavelengths from each other.

16. The light emitting device of claim 13, wherein the light emitter includes a first semiconductor layer, a second semiconductor layer, and third semiconductor layer.

17. The light emitting device of claim 16, wherein the light emitter further includes a first electrode electrically connected to the first semiconductor layer, wherein the first electrode includes a material including at least one of Al, Ti, Cr, Ni, Au, Ag, Sn, W, Cu, or alloys.

18. The light emitting device of claim 16, wherein the light emitter further includes a second electrode electrically connected to the third semiconductor layer, wherein the second electrode is configured to transmit a light emitted from the second semiconductor layer.

19. The light emitting device of claim 18, wherein the plurality of light sources are arranged on the printed circuit board in a pattern, wherein the pattern is one of a column, a matrix, or a zigzag.

* * * * *